(12) United States Patent
Mansouri et al.

(10) Patent No.: US 11,868,117 B2
(45) Date of Patent: *Jan. 9, 2024

(54) SYSTEMS AND METHODS FOR INCORPORATING PROXY COMPONENTS IN AN INDUSTRIAL AUTOMATION SYSTEM

(71) Applicant: Rockwell Automation Technologies, Inc., Mayfield Heights, OH (US)

(72) Inventors: Haithem Mansouri, Beachwood, OH (US); William Sinner, Jackson, WI (US); Charles M. Rischar, Chardon, OH (US); Subbian Govindaraj, Solon, OH (US); Michael Kalan, Highland Heights, OH (US); Juergen Weinhofer, Chagrin Falls, OH (US); Andrew R. Stump, Mentor, OH (US); Daniel S. DeYoung, Hudson, OH (US); Frank Kulaszewicz, Singapore (SG); Edward A. Hill, Chagrin Falls, OH (US); Keith Staninger, Aurora, OH (US); Matheus Bulho, Bainbridge Township, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/648,493

(22) Filed: Jan. 20, 2022

(65) Prior Publication Data

US 2022/0147028 A1 May 12, 2022

Related U.S. Application Data

(63) Continuation of application No. 16/694,083, filed on Nov. 25, 2019, now Pat. No. 11,231,697, which is a
(Continued)

(51) Int. Cl.
*G05B 19/418* (2006.01)
*G06Q 10/0631* (2023.01)
(Continued)

(52) U.S. Cl.
CPC ... *G05B 19/41815* (2013.01); *G05B 19/4188* (2013.01); *G06F 30/00* (2020.01);
(Continued)

(58) Field of Classification Search
CPC .......... G05B 19/41815; G05B 19/4188; G05B 2219/31018; G05B 2219/31124;
(Continued)

(56) References Cited

U.S. PATENT DOCUMENTS 7,526,794 B2   4/2009   Chand et al.
7,996,093 B2   8/2011   Govindaraj et al.
(Continued)

FOREIGN PATENT DOCUMENTS

EP   2530543 A1   12/2012

OTHER PUBLICATIONS

European Search Report for EP Application No. 15171813 dated Mar. 21, 2016.
(Continued)

*Primary Examiner* — Mohammad Ali
*Assistant Examiner* — Saad M Kabir
(74) *Attorney, Agent, or Firm* — Fletcher Yoder, PC

(57) ABSTRACT

An industrial automation component may receive design information associated with an arrangement of one or more industrial automation components in an industrial automation system and identify a first portion of the industrial automation components in the industrial automation system that is unable to interface with a second portion of industrial automation components based on the design information. The industrial automation component may then generate a
(Continued)

list of industrial automation components based on the first portion of the industrial automation components and the second portion of industrial automation components, wherein each of the list of industrial automation components is configured to translate a first set of data associated with the first portion of the industrial automation components to a second set of data configured to be at least partly interpretable by the second portion of industrial automation components.

20 Claims, 13 Drawing Sheets

Related U.S. Application Data continuation of application No. 14/559,624, filed on Dec. 3, 2014, now Pat. No. 10,488,850.

(60) Provisional application No. 62/012,022, filed on Jun. 13, 2014.

(51) Int. Cl.
*G06Q 10/20* (2023.01)
*G06Q 10/0637* (2023.01)
*G06F 30/00* (2020.01)

(52) U.S. Cl.
CPC ..... *G06Q 10/0631* (2013.01); *G06Q 10/0637* (2013.01); *G06Q 10/20* (2013.01); *Y02P 90/02* (2015.11); *Y02P 90/80* (2015.11)

(58) Field of Classification Search
CPC .......... G05B 2219/31347; G06F 30/00; G06Q 10/0631; G06Q 10/0637; G06Q 10/20; Y02P 90/02; Y02P 90/80
See application file for complete search history.

(56) References Cited

U.S. PATENT DOCUMENTS

| | | | |
|---|---|---|---|
| 8,200,591 | B2 | 6/2012 | Govindaraj et al. |
| 8,229,575 | B2 | 7/2012 | Vasko et al. |
| 8,606,928 | B2 | 12/2013 | Vasko et al. |
| 9,880,530 | B2 | 1/2018 | Govindaraj et al. |
| 11,231,697 | B2 * | 1/2022 | Mansouri ......... G05B 19/41815 |
| 2009/0300021 | A1 | 12/2009 | Vasko et al. |
| 2010/0030881 | A1 | 2/2010 | Moreira Sa de Souza et al. |
| 2010/0042586 | A1 | 2/2010 | Vasko et al. |
| 2010/0076575 | A1 | 3/2010 | Vasko et al. |
| 2011/0022198 | A1 | 1/2011 | Plache et al. |
| 2012/0296452 | A1 | 11/2012 | Baier et al. |
| 2013/0218300 | A1 | 8/2013 | Jartyn |

OTHER PUBLICATIONS

European Search Report; EP Application No. 20163253.6; dated Jul. 16, 2020.
EP Examination Communication Pursuant to Article 94(3); EP Application No. 20163253.9, dated Sep. 13, 2021.

* cited by examiner

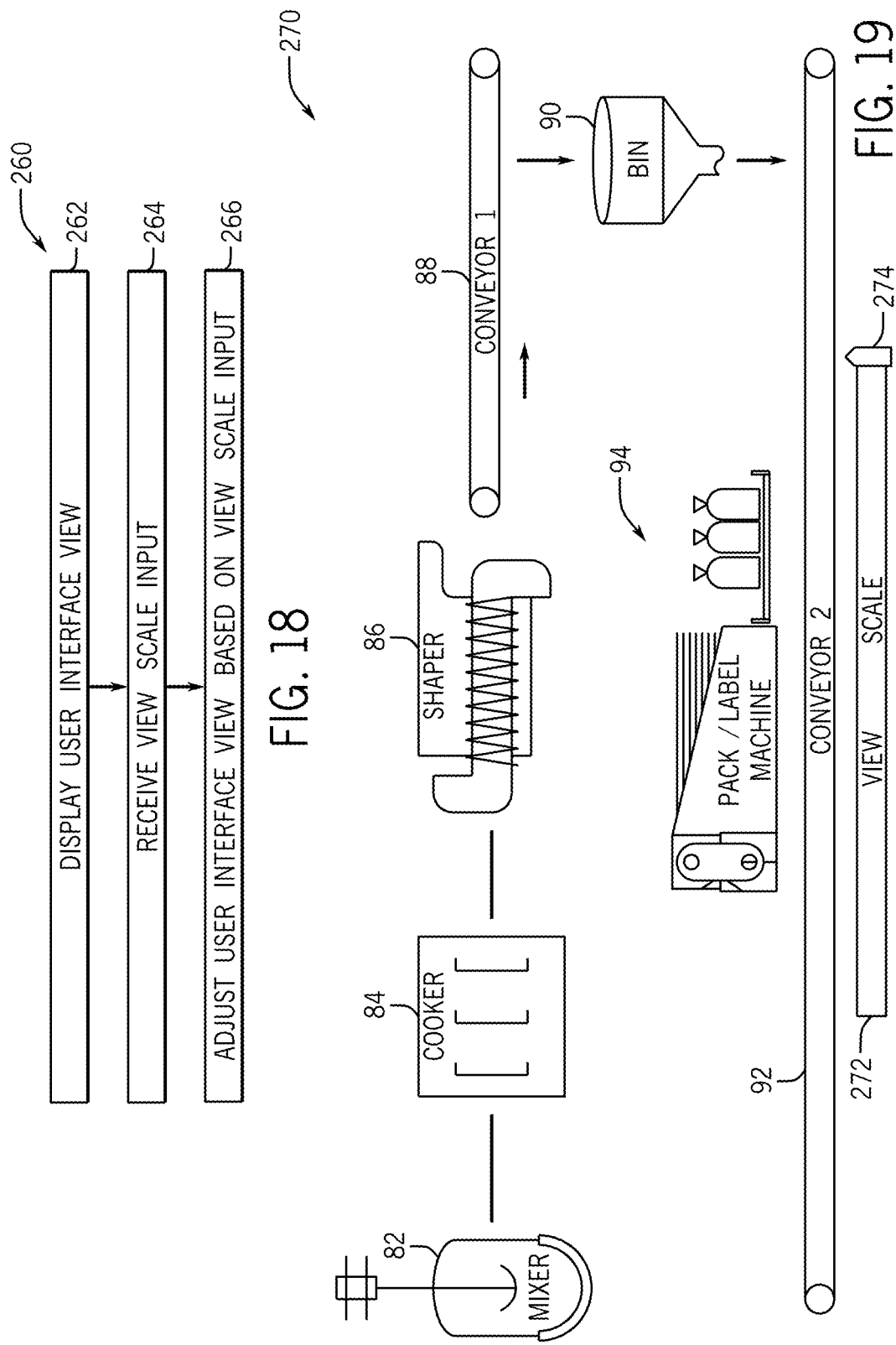

SYSTEMS AND METHODS FOR INCORPORATING PROXY COMPONENTS IN AN INDUSTRIAL AUTOMATION SYSTEM

CROSS REFERENCE TO RELATED APPLICATIONS

This application is a continuation of U.S. Non-Provisional application Ser. No. 16/694,083, entitled "SYSTEMS AND METHODS FOR INCORPORATING PROXY COMPONENTS INTO AN INDUSTRIAL AUTOMATION SYSTEM", filed Nov. 25, 2019, which is a continuation of U.S. Non-Provisional application Ser. No. 14/559,624, entitled "SYSTEMS AND METHODS FOR INCORPORATING PROXY COMPONENTS INTO AN INDUSTRIAL AUTOMATION SYSTEM", filed Dec. 3, 2014, which claims priority to U.S. Provisional Patent Application No. 62/012,022, entitled "A SYSTEM TOOL FOR AN INDUSTRIAL AUTOMATION SYSTEM", filed Jun. 13, 2014, which is herein incorporated by reference.

This application is related to U.S. patent application Ser. No. 14/267,481, entitled "SYSTEMS AND METHODS FOR INDUSTRIAL AUTOMATION DEVICE AWARENESS", filed May 1, 2014; U.S. patent application Ser. No. 14/267,508, entitled "SYSTEMS AND METHODS FOR OPERATING INDUSTRIAL AUTOMATION DEVICES BASED ON HIERARCHICAL LEVEL AWARENESS", filed May 1, 2014; U.S. patent application Ser. No. 14/267,576, entitled "SYSTEMS AND METHODS FOR ADJUSTING OPERATIONS OF AN INDUSTRIAL AUTOMATION SYSTEM BASED ON MULTIPLE DATA SOURCES", filed May 1, 2014; U.S. patent application Ser. No. 14/267,594, entitled "SYSTEMS AND METHODS FOR BALANCING LOADS IN AN INDUSTRIAL AUTOMATION SYSTEM", filed May 1, 2014; and U.S. patent application Ser. No. 14/267,617, entitled "SYSTEMS AND METHODS FOR BROADCASTING DATA AND DATA TAGS ASSOCIATED WITH AN INDUSTRIAL AUTOMATION SYSTEM", filed May 1, 2014, which are herein incorporated by reference.

BACKGROUND

The present disclosure generally relates to designing an industrial automation system. More specifically, the present disclosure relates to systems and methods for identifying industrial automation components that may be used to produce certain products or process certain materials in an industrial automation system.

BRIEF DESCRIPTION

In one embodiment, an industrial automation component may receive design information associated with an arrangement of one or more industrial automation components in an industrial automation system and identify a first portion of the industrial automation components in the industrial automation system that is unable to interface with a second portion of industrial automation components based on the design information. The industrial automation component may then generate a list of industrial automation components based on the first portion of the industrial automation components and the second portion of industrial automation components, wherein each of the list of industrial automation components is configured to translate a first set of data associated with the first portion of the industrial automation components to a second set of data configured to be at least partly interpretable by the second portion of industrial automation components.

In another embodiment, a controller, may receive design data associated with one or more industrial automation components in an industrial automation system, receive a first set of data acquired by a first portion of the industrial automation components, identify a second portion of the industrial automation components lacking communication abilities based on the design data and the first set of data, and generate virtual data associated with the second portion of the industrial automation components based on the first set of data.

In yet another embodiment, a non-transitory computer-readable medium may include computer-executable instructions that cause a computing device to receive a first set of data from one or more industrial automation components manufactured by a first entity, receive reference data configured to translate the first set of data into a second set of data interpretable by a respective industrial automation component configured to process the non-transitory computer-readable medium, wherein the respective industrial automation component is manufactured by a different entity, and convert the first set of data into the second set of data based on the reference data.

DRAWINGS

These and other features, aspects, and advantages of the present invention will become better understood when the following detailed description is read with reference to the accompanying drawings in which like characters represent like parts throughout the drawings, wherein:

FIG. 18 illustrates a flowchart of a method for adjusting a scale of the user interface view, in accordance with an embodiment presented herein;

FIG. 19 illustrates a schematic diagram of an example user interface view with a view scale graphical input, in accordance with an embodiment presented herein;

DETAILED DESCRIPTION

Figure 1:
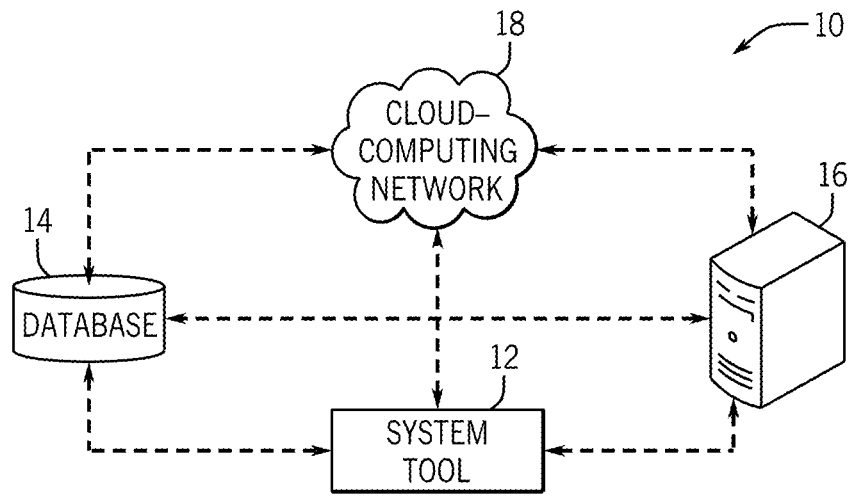
FIG. 1 illustrates a block diagram of an industrial automation system network that may be employed to generate recommendations concerning industrial automation components that may be useful in an industrial automation system, in accordance with an embodiment presented herein.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

Embodiments of the present disclosure are generally directed towards an industrial automation system tool that recommends a number of industrial automation components that may be used when commissioning or designing an industrial automation system. Generally, designing a particular industrial automation system to manufacture a particular product or perform certain processing tasks (e.g., oil refining) can prove to be a difficult task. Different industrial automation systems may be designed in different configurations, use different sets or types of components, perform different types of processes, have different country settings based on its location, and the like. In one embodiment, a system tool may be used to assist a designer or industrial automation system operator with the design of an industrial automation system. That is, the system tool may use information related to the designer or an organization associated with the designer to automatically provide recommendations regarding the types of industrial automation components that may be useful when building an industrial automation system that aligns with the purposes of the designer or the associated organization. Moreover, the system tool may also provide guidance by automating a workflow used when configuring the industrial automation components to perform their respective functions.

In addition to providing assistance to a user when designing the industrial automation system, the system tool may also control operations of the industrial automation components within the designed industrial automation system after the industrial automation components start performing their respective functions. Moreover, the system tool may also monitor various aspects of each respective component to ensure that each respective component is operating efficiently, maintained well, and the like. As such, the system tool may provide a multitude of services for each industrial automation component during the complete lifecycle (e.g., design, operation, maintenance, replacement) of the respective industrial automation component.

Embodiments of the present disclosure are also generally directed towards using the system tool to analyze a topology or types of components present in the industrial automation system design or an existing industrial automation system. Upon analyzing the industrial automation system, the system tool may identify one or more legacy components or previously installed components that output data, which newer components of the industrial automation system may be unable to interpret. That is, a first set of components (e.g., newer components) in the industrial automation system may not be able to interpret or receive, in some instances, data from a second set of components (e.g., legacy components) in the industrial automation system. The inability of the first set of components to interpret the data acquired by the second set of data may be due to differences between the formats of the data acquired by the second set of components and typically analyzed by the first set of components. As such, the system tool may identify locations within the industrial automation system where proxy-interface components may be added to enable the newer components to receive and interpret data output by the legacy components. The system tool may then provide a list of devices or components (e.g., proxy-interface components) that may be used to provide an interface between the newer components and the legacy components. The proxy-interface components may provide translation services for the legacy components that may provide data in a different format or configuration from which the newer components may be designed to interpret. Upon translating the data output by the legacy components, the proxy-interface components may forward the translated data to the newer components, such that the newer components may be able to interpret the data provided by the legacy components. As a result, the newer components may have access to additional data concerning the industrial automation system to operate the industrial automation system more efficiently.

In one embodiment, the system tool may also assist a user retrofit an existing industrial automation system to enable various industrial automation components to account for the presence of communication-lacking components when performing their respective operations in the industrial automation system. For example, the system tool may recommend replacement or additional components to add at various positions within the industrial automation system, such that the replacement or additional components may generate virtual data for various components that lack communication capabilities. This virtual data may then be transmitted to other industrial automation components that may use the virtual data when determining its respective operations.

To enable a user or operator of the system tool to perform the above listed operations more easily, the system tool may present a user interface view in a display device, such that the user interface view may adjust with respect to the operator's use of the system tool. That is, the system tool may track the operator's usage history and modify the user interface view based on the operator's preferences, uses, and the like. In certain embodiments, the user interface view may adjust also based on external factors such as production schedules, material availability, power costs (e.g., scheduled price for power at various times), weather, climate, news, and the like.

System Design

By way of introduction, FIG. 1 illustrates an industrial automation system network 10 that may be used to gather information related to a designer of an industrial automation system, an organization that employs one or more industrial automation systems to produce or manufacture certain products, an operator of various industrial automation components that may be used in an industrial automation system, a maintainer of the various industrial automation components, and the like. The industrial automation system may be any system in the material handling, packaging industries, manufacturing, processing, batch processing, or any technical field that employs the use of one or more industrial automation components. The industrial automation system network 10 may include a system tool 12, a database 14, one or more servers 16, a cloud network 18, and the like.

The system tool 12 may be a computing device that may include communication abilities, processing abilities, and the like. In one embodiment, the system tool 12 may include software that may perform certain computer-executable instructions that may generate a list of industrial automation components that may be suitable for desired operations of an industrial automation system being designed or modified by the software user. In one embodiment, the system tool 12 may include a graphical user interface (GUI) that may enable a user to interact with the system tool via a display. Keeping this in mind, the system tool 12 may be incorporated within a controller, such as a programmable logic controller (PLC), a programmable automation controller (PAC), or any other controller that may monitor, control, and operate an industrial automation component. The system tool 12 may also be incorporated into a stand-alone computing device (e.g., general purpose computer), such as a desktop computer, a laptop computer, a tablet computer, a mobile device computing device, a dedicated appliance, or the like.

In one embodiment, the system tool 12 may be implemented virtually in a cloud-accessible platform (i.e., cloud-computing system), one or more servers, in various computing devices (e.g., general purpose computers), and the like. As such, the system tool 12 may operate as a soft controller or as a design engine running in the cloud-computing system. By virtually implementing the system tool 12 in a cloud-computing system, the system tool 12 may use a distributed computing architecture to provide a number of users access to the same system and data. As more data is made available to the system tool 12, the system tool 12 may provide additional design options to the users based on the actions or designs undertaken by other users. Additional details regarding the system tool 12 will be discussed below with reference to FIG. 2.

The database 14 may include a collection of data associated with the user of the system tool 12, an organization that corresponds to the user of the system tool 12, an industry or type of industry associated with the user, industries related to the user, industries unrelated to the user, and the like. The database 14 may be stored on a local or remote storage device accessible by the system tool 12 or by components that interact with the system tool 12. In one embodiment, the database 14 may be stored in the cloud network 18, such that the system tool 12 may access the data of the database 14 from various components or parts of the industrial automation system. In any case, the database 14 may store data that includes profiles associated with various organizations and/or users of the system tool 12.

The profile for each organization or user may include an identification number, a history of previous purchases, an industry type, a list of products manufactured, and the like. The profile may also indicate a user role associated with the user interacting with the system tool 12. The user role may include a designer who designs the industrial automation system, an operator who operates the industrial automation components, a maintainer who performs maintenance operations on the industrial automation components, a purchaser who enhances or replaces the industrial automation components, and the like. The profile may also indicate a locale preference that may be associated with the part of the world that the user is from or accessing the system tool 12. For instance, the locale preference may indicate a preferred language that the user may prefer or be most familiar with.

In certain embodiments, the profile may include training records for one or more users of an organization. As such, the system tool 12 may present information to the user based on a level of training. The database 14 may also include a comprehensive list of industrial automation components that may be of interest to user or organization associated with the system tool 12. The list of industrial automation components may include details indicating what type of industries that the respective industrial automation component may be employed, a list of organizations that have purchased the respective industrial automation components, a list of products or services produced using the respective industrial automation components, a list of other industrial automation components that are typically associated with or are combined with the respective industrial automation components, and the like. Generally, the system tool 12 may use the data in the database 14 to identify industrial automation components that may be desired or may improve various production goals of the user or organization associated with the system tool 12. In addition to the list of industrial automation components, the database 14 may also include various types of software tools that may be used to analyze data acquired by components in the industrial automation system, application libraries, seed project configurations, project layouts, and other types of data that may be useful when designing the industrial automation system.

In one embodiment, the system tool 12 may use the data provided by the database 14 to perform various queries with respect to the data and gather information related to organization or user. The system tool 12 may then use this information to identify industrial automation components that may be of interest to the user of the sytem tool 12. That is, the system tool 12 may analyze the information along with certain inputs received from the user to identify industrial automation components that may relate to an industrial automation system being designed, modified, or maintained by the user.

The servers 16 may include a computer or a collection of computers that may perform various processing or data analysis operations described above. The servers 16 may also store data related to the profiles associated with various organizations and/or users of the system tool 12 along with the data related to the industrial automation components that may be recommended for the user. In one embodiment, the servers 16 may cooperate with the system tool 12 to perform distributed data processing for identifying industrial automation components to recommend to the user of the system tool 12.

The cloud-computing network 18 may include a number of computers that may be connected through a real-time communication network, such as the Internet, EtherNet/IP, ControlNet, or the like. In one embodiment, large-scale analysis operations may be distributed over the computers that make up the cloud-computing network 18. Generally, the computers or computing devices provided by the cloud-computing network 18 may be dedicated to performing various types of complex and time-consuming analysis that may include analyzing a large amount of data. As a result, the system tool 12 may provide recommendations to the user using complex data processing algorithms without laboring its own processors with all of the advanced calculations and processing involved in analyzing large amounts of data associated with the user and/or the user's organization, associated industries, related industries, and each respective industrial automation component.

Keeping the foregoing in mind, the system tool 12, the database 14, the servers 16, and cloud-computing network 18 may communicate with each other as shown in FIG. 1 via a wired or wireless communication network. As mentioned above, the system tool 12 may be a controller or a general purpose computer; however, it should be noted that the system tool 12 may be stored in the cloud-computing network 18 or the servers 16 and accessed via a controller, a general purpose computer, or the like. As such, the cloud-computing network 18 or the servers 16 may perform the analysis and data processing operations, as well as system design functions, to identify industrial automation components. The cloud-computing network 18 or the servers 16 may then send the results of the analyses to the system tool 12.

Figure 2:
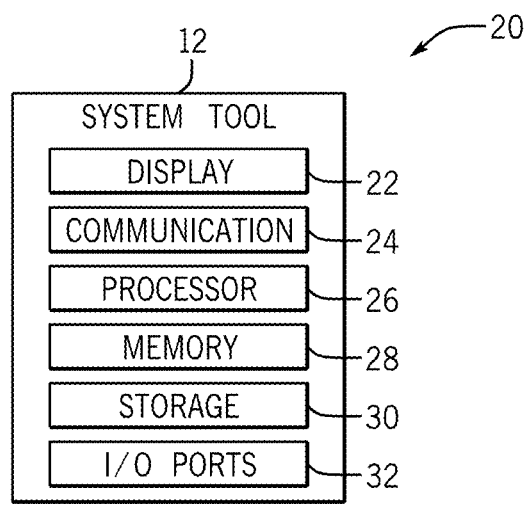
FIG. 2 illustrates a block diagram of components within a system tool that may be part of the industrial automation system network of FIG. 1, in accordance with an embodiment presented herein.

FIG. 2 illustrates a detailed block diagram 20 of example components in the system tool 12 that may be used to perform various methods and techniques described herein. Referring now to FIG. 2, the system tool 12 may include a display component 22, communication component 24, a processor 26, a memory 28, a storage 30, input/output (I/O) ports 32, and the like. The display component 22 may be used to display various images generated by system tool 12, such as a graphical user interface (GUI) for operating the system tool 12. The display component 22 may be any suitable type of display, such as a liquid crystal display (LCD), plasma display, or an organic light emitting diode (OLED) display, for example. Additionally, in one embodiment, the display component 22 may be provided in conjunction with a touch-sensitive mechanism (e.g., a touch screen) that may function as part of a control interface for the system tool 12.

The communication component 24 may be a wireless or wired communication component that may facilitate communication between the system tool 12, the database 14, the servers 16, the cloud-computing network 18, control system components, and the like. In one embodiment, the system tool 12 may use the communication component 24 to communicatively couple to the database 14, the servers 16, the cloud-computing network 18, and the like via a communication network such as the Internet, EtherNet/IP, ControlNet, DeviceNet, or any other industrial communication network protocol.

The processor 26 may be any type of computer processor or microprocessor capable of executing computer-executable code. The processor 26 may also include multiple processors that may perform the operations described below.

The memory 28 and the storage 30 may be any suitable articles of manufacture that can serve as media to store processor-executable code, data, or the like. These articles of manufacture may represent computer-readable media (i.e., any suitable form of memory or storage) that may store the processor-executable code used by the processor 26 to perform the presently disclosed techniques. The memory 28 and the storage 30 may also be used to store the data, analysis of the data, and the like. The memory 28 and the storage 30 may represent non-transitory computer-readable media (i.e., any suitable form of memory or storage) that may store the processor-executable code used by the processor 26 to perform various techniques described herein. It should be noted that non-transitory merely indicates that the media is tangible and not a signal.

The input/output (I/O) ports 32 may be interfaces that may couple to I/O modules that may enable the system tool 12 to communicate with various devices in the industrial automation system. As such, the I/O ports 32 may enable various devices to connect to the system tool 12 via an industrial control network or the like, thereby providing the system tool 12 an indication as to the types of I/O modules that may currently exist in the industrial automation system. The system tool 12 may then store this information in the memory 28, the storage 30, the database 14, the cloud-computing network 18, or any other storage medium, such that the system tool 12 may use the stored information for additional data processing (e.g., learning user preferences, predicting user preferences). The I/O ports 32 may also couple to I/O devices such as keyboards, mice, etc. that may be used to interact with the system tool 12.

Figure 3:
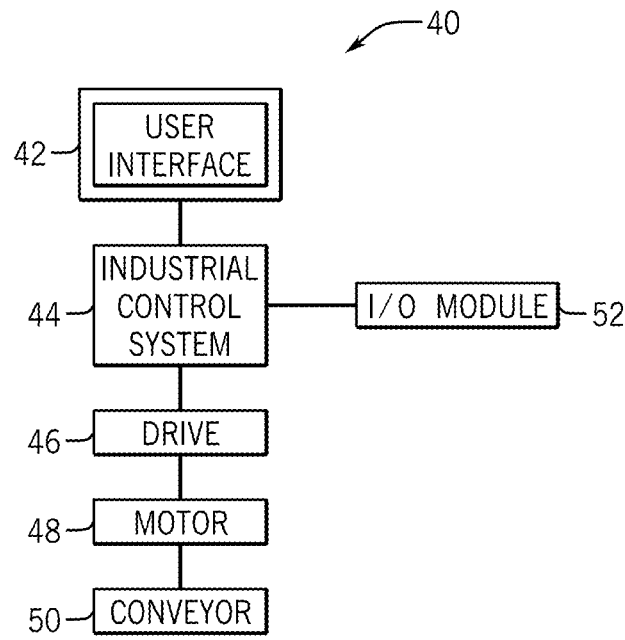
FIG. 3 illustrates a block diagram of an example industrial automation system that includes industrial machines and components recommended by the system tool of FIG. 2, in accordance with an embodiment presented herein.

Keeping the foregoing in mind, in a design phase of an industrial automation system, the system tool 12 may be used to identify various industrial automation components that may suit the design of an industrial automation system of the user or organization using the system tool 12. Generally, the industrial automation system may include various industrial automation components that work together to perform certain operations that may be related to producing a product, processing a chemical, or the like. FIG. 3, for instance, illustrates an example industrial automation system 40 that includes a number of example industrial automation components that work together to operate a conveyor.

As shown in FIG. 3, the industrial automation system 40 may include industrial automation components, such as a user interface 42, an industrial control system 44, a drive 46, a motor 48, a conveyor 50, and an input/output (I/O) module 52. The user interface 42 may modify and/or view the settings and operations of the industrial control system 44. As such, the user interface 42 may be a user interface that may include a display and an input device used to communicate with the industrial control system 44. The display may correspond to the display 22 described above and may be used to display various images generated by industrial control system 44, such as a graphical user interface (GUI) for operating the industrial control system 44. In some embodiments, the user interface 42 may be characterized as a human-machine interface, a human-interface machine, or the like.

The industrial control system 44 may be a computing device that may include communication abilities, processing abilities, and the like. For example, the industrial control system 44 may be a controller, such as a programmable logic controller (PLC), a programmable automation controller (PAC), or any other controller that may monitor, control, and operate an industrial automation component. The industrial control system 44 may be incorporated into any physical device (e.g., the industrial automation components) or may be implemented as a stand-alone computing device (e.g., general purpose computer), such as a desktop computer, a laptop computer, a tablet computer, a mobile device computing device, or the like.

In certain embodiments, the industrial control system 44 may be implemented within devices that enable industrial automation components to connect and communicate with each other. For instance, the industrial control system 44 may be implemented within network routers and/or switches. In this manner, the network routers and/or switches may host the industrial control system 44 that may control and operate the industrial control components that may be communicatively coupled to the respective network router and/or switch.

The industrial control system 44 may be implemented virtually in a cloud-accessible platform (e.g., cloud-computing network 18), one or more servers, in various computing devices (e.g., general purpose computers), and the like. As such, the industrial control system 44 may operate as a soft controller or as a control engine running in the cloud-computing system.

Generally, the industrial control system 44 may be communicatively coupled to certain devices that may be used to control or affect the operation of the industrial automation system 40. For instance, the industrial control system 44 may be coupled to the drive 46. The drive 46 may be an electrical drive that may convert an input alternating current (AC) voltage into a controllable AC voltage using a rectifier circuit and an inverter circuit. The industrial control system 44 may thus be a controller that may control the operation of the drive 46. The drive 46 may be coupled to a motor 48, which may operate a component such as a conveyor 50 or the like.

The industrial control system 44 may also be communicatively coupled to input/output (I/O) modules 52. The I/O modules 52 may enable the industrial control system 44 to communicate with various types of other devices in the industrial automation system 40. In one embodiment, the industrial control system 44 may be communicatively coupled to the user interface 42, the drive 46, the motor 48, the conveyor 50, the I/O module 52, and the like via a communication network such as the Internet, EtherNet/IP, ControlNet, DeviceNet, or any other industrial communication network protocol.

As mentioned above the industrial automation components may include the user interface 42, the industrial control system 44, the drive 46, the motor 48, the conveyor 50, the input/output (I/O) module 52, and any other device that may enable an industrial automation system to produce or manufacture products or process certain materials. In addition to the aforementioned types of industrial automation components, the industrial automation components may also include controllers, input/output (I/O) modules, motor control centers, motors, human machine interfaces (HMIs), user interfaces, contactors, starters, sensors, drives, relays, protection devices, switchgear, compressors, network switches (e.g., Ethernet switches, modular-managed, fixed-managed, service-router, industrial, unmanaged, etc.), and the like. The industrial automation components may also be related to various industrial equipment such as mixers, machine conveyors, tanks, skids, specialized original equipment manufacturer machines, and the like. The industrial automation components may also be associated with devices used by the equipment such as scanners, gauges, valves, flow meters, and the like.

Keeping this in mind, the industrial automation system 40 may consist of a number of different types of industrial automation components. As such, the system tool 12 may be useful in providing the user a list of industrial automation components that may be suited for the industrial automation system that he may desire. That is, instead of perusing through all of the types of industrial automation components that may be available to the user, the system tool 12 may identify a subset of all of the types of industrial automation components that may be best suited for the purposes of the user and the prospective industrial automation system. Moreover, the system tool 12 may list the identified types of industrial automation components according to a rank or order that the system tool 12 may determine to be of most interest to the user.

In one embodiment, the system tool 12 may access information regarding each of the industrial automation components available to the user to identify the industrial automation components that may suit the purpose of the user of the system tool 12. As such, the user of the system tool 12 may be guided in a process for designing the respective industrial automation system. For example, if the user indicates to the system tool 12 that prospective industrial automation system should include the conveyor 50, the system tool 12 may recommend that the user also include the user interface 42, the industrial control system 44, the drive 46, and the motor 48 to operate the conveyor 50.

Figure 4:
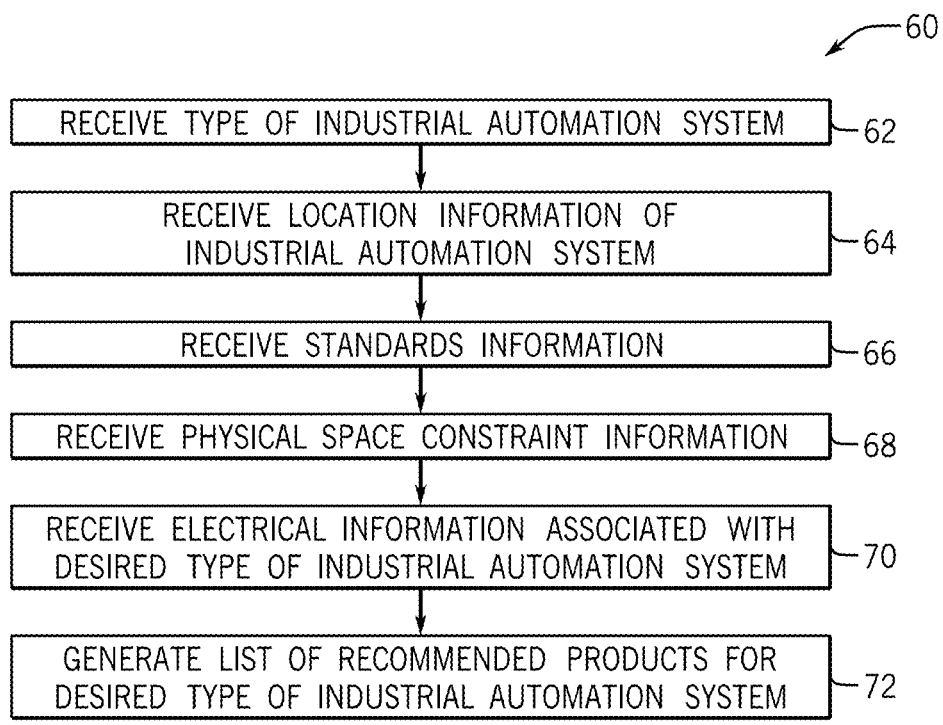
FIG. 4 illustrates a flowchart of a method for generating a list of industrial automation components for use in an industrial automation system as determined by the system tool of FIG. 2, in accordance with an embodiment presented herein.

Keeping the above-mentioned example in mind, FIG. 4 illustrates a flow chart of a method 60 that may be employed by the system tool 12 to identify industrial automation components that may be useful in the design of an industrial automation system for the user. Although the method 60 is depicted in a particular order, it should be understood that the method 60 may be performed in a number of different orders and may not include all of the steps described herein. In certain embodiments, the system tool 12 may be implemented as a visualization editor program that displays visualizations or graphics related to each block of the method 60. The system tool 12 may thus use the visualization editor program to propose a layout of industrial automation components, provide an image of a proposed industrial automation component, provide an interface between a user and the system tool 12, and the like.

Referring now to FIG. 4, at block 62, the system tool 12 may receive information regarding a type of industrial automation system being designed or a type of industry that the industrial automation system will be used. That is, the system tool 12 may receive information regarding a product being produced or a process being performed by the prospective industrial automation system. In one embodiment, the system tool 12 may present a list of predefined types of industrial automation systems that may be commonly used by other system tool 12 users designing or operating the same type of industrial automation system. In one example, the system tool 12 may receive input from the user indicating that the user desires to build a jellybean manufacturing facility.

In another embodiment, the system tool 12 may receive information regarding operational information of the industrial automation system being designed. The operational information of the industrial automation system may include variables or information related to how the industrial automation system will be operated. For example, the operational information may include information related to the products being produced by the industrial automation systems, the processes being performed by the industrial automation system, the location in which the industrial automation system may be commissioned, standards related to the operation of the industrial automation system, and the like. By way of example, blocks 64-70 detail some exemplary types of information that may be used to generate a list of industrial automation components that may be useful in the design of an industrial automation system.

The system tool 12 may also receive information regarding the type of user designing or operating the industrial automation system. For instance, the user may be an end user who may use or receive the products created by the industrial automation system. The user may also be a original equipment manufacturer that produces products or performs processes.

At block 64, the system tool 12 may receive location information that indicates an expected location of the prospective industrial automation system. The location information may include country information, city information, state information, and the like. The location information may also indicate whether the industrial automation system will operate indoors or outdoors. The system tool 12 may then use the location information to identify industrial automation components. For instance, if the system tool 12 receives location information indicating that the prospective industrial automation system will be subject to an external environment in Las Vega, Nevada, the system tool 12 may identify industrial automation components that may be designed to operate outside with relatively high temperatures as expected in Las Vegas.

At block 66, the system tool 12 may receive standards information related to various engineering standards, safety standards, or other standards related to operating the industrial automation system. In one embodiment, the user may provide various parameters related to the expected operations of the industrial automation system or of each component in the industrial automation system. For example, the standards information may include parameters indicating that each industrial automation component should withstand a surge of power for some period of time for up to a certain percentage (e.g., 200%) of its normal operating load.

At block 68, the system tool 12 may receive physical dimensions that may define a space for the facility in which the industrial automation system may be placed or a space in which various industrial automation components may be placed within the facility. As such, the system tool 12 may identify industrial automation components that may have a form factor to fit within the physical constraints of the facility or the physical constraints of the space designated for a particular component. Moreover, the system tool 12 may identify a number of industrial automation components to perform the desired operation of the industrial automation system and to fit within the physical dimensions received at block 68. The information received at blocks 64-68 may be referred to as design parameters as they regard certain design constraints or preferences of the industrial automation system.

In certain embodiments, the system tool 12 may identify industrial automation components based on a physical distance between locations at which the components may be positioned. That is, the system tool 12 may determine whether a component that has multiple channels may be shared with other components. Also, upon recognizing that various components may be physically positioned near each other and may be capable of sharing channels with each other, the system tool 12 may provide a list of appropriate bridging devices and/or appropriate cabling that may be used to enable the components to share channels.

At block 70, the system tool 12 may receive electrical information associated with the prospective industrial automation system. The electrical information may include drawings that specify a number of industrial automation components that may be electrically coupled together in a particular manner. The electrical information may also indicate a type of power supply available for the prospective industrial automation system. For example, the power supply may include a three-phase power system that provides a particular voltage and a maximum current rating.

In one embodiment, system tools may receive the information at blocks 62, 64, 66, 68, and 70 in an electronic form. For example, at block 70, the system tool 12 may receive electronic drawings (e.g., CAD/VNLI drawings) that may provide information related to input and output power characteristics for various industrial automation components that may be part of the industrial automation system. In the same manner, at block 68, the system tool 12 may receive data that includes a three-dimensional model of the prospective industrial automation system.

At block 72, the system tool 12 may generate a list of one or more industrial automation components that may best suit the interests of the user of the system tool 12 or the purposes of the prospective industrial automation system. In one embodiment, the system tool 12 may generate the list of industrial automation components based on one or more of the received inputs at blocks 62-70. Therefore, based on the information received by the system tool 12, the system tool 12 may assist a user in designing an industrial automation system customized to the user's desires. In this manner, the system tool 12 may be used to build an industrial automation system based on function. For instance, if the system tool 12 receives information indicating that the user is associated with a company that builds printing presses, the system tool 12 may initially present the user with components that may be compatible or generally used for the purpose of building a printing press. As a result, the system tool 12 may reduce the total number of components or sets of components displayed to the user, thereby enabling the user to design the industrial automation system customized for his purposes more efficiently.

Additionally, in one embodiment, the system tool 12 may display the generated list of industrial automation components via the display 22 as the system tool 12 receives data at blocks 62-70. As such, the displayed list may reduce in quantity as the system tool 12 receives more information regarding the desires of the user. In this way, the user is provided with a narrow or customized list of industrial automation components that the users may most likely be interested in using for their respective industrial automation system. Further, as mentioned above, the system tool 12 may display the list of industrial automation components according to a rank that corresponds to how the system tool 12 may expect the user to rank each listed component. The rank may be determined based on a number of the inputs received at blocks 62-70 that match a respective component.

The generated list of industrial automation components may also include software or firmware updates or patches that may be added to an existing control system of an industrial automation component. The software update or patch may be used to provide proxy-interface services for certain legacy components. Additional details regarding proxy-interface services will be described below with reference to FIGS. 8-10.

In certain embodiments, upon receiving the inputs described above, the system tool 12 may also propose a design layout that may indicate how various industrial automation components for the received type of industrial automation system may be arranged. As such, the system tool 12 may automatically generate a topology associated with the design layout, a starting project, and the like with suggested components for the design layout based on the data received.

The system tool 12 may propose a design layout based on stored layout designs that may be available via libraries that include example design layouts employed in similar types of industrial automation systems. The design layout may be automatically generated based on various information received. That is, the input received at blocks 62-70 may provide the system tool 12 certain insights with respect to building a starting project with a recommended configuration based on a respective industry and/or preferences of the user. Moreover, the system tool 12 may also provide appropriate application code libraries based on the respective industry and/or preferences of the user.

The design layout may include a template of industrial automation components that may be arranged in a particular manner. The template may be associated with a particular project that defines a type of industry that the industrial automation system may be, a type of user using the industrial automation system, or the like. In certain embodiments, the design layout may be based on identified industrial automation system designs having a similar topology.

The design layout may be arranged or presented as a logical layout, a physical layout, or a network layout. The logical layout may depict the industrial automation components for the design layout in a logical manner. That is, the industrial automation components may be depicted in a tiered or tree structure that have larger components depicted as part of a high-level tier and smaller components that may be part of or connected to a respective larger component as part of a lower-level tier.

The physical layout may include depicting the design of the industrial automation system with respect to the physical location of each industrial automation component of the industrial automation design. The network layout of the industrial automation system may depict how each industrial automation component may be communicatively coupled to each other via a network connection or the like.

As an example of the method 60 described above, FIG. 5 illustrates a block diagram of a jellybean manufacturing system 80 that includes industrial automation components recommended by the system tool 12. As such, the system tool 12 may receive an input (e.g., at block 62) indicating that the user desires to build a jellybean manufacturing plant. In one embodiment, the system tool 12 may then search the database 14, the servers 16, and the cloud-computing network 18 (or using the cloud-computing network 18) to identify all of the industrial automation components that may have been associated with a jellybean manufacturing plant.

Figure 5:
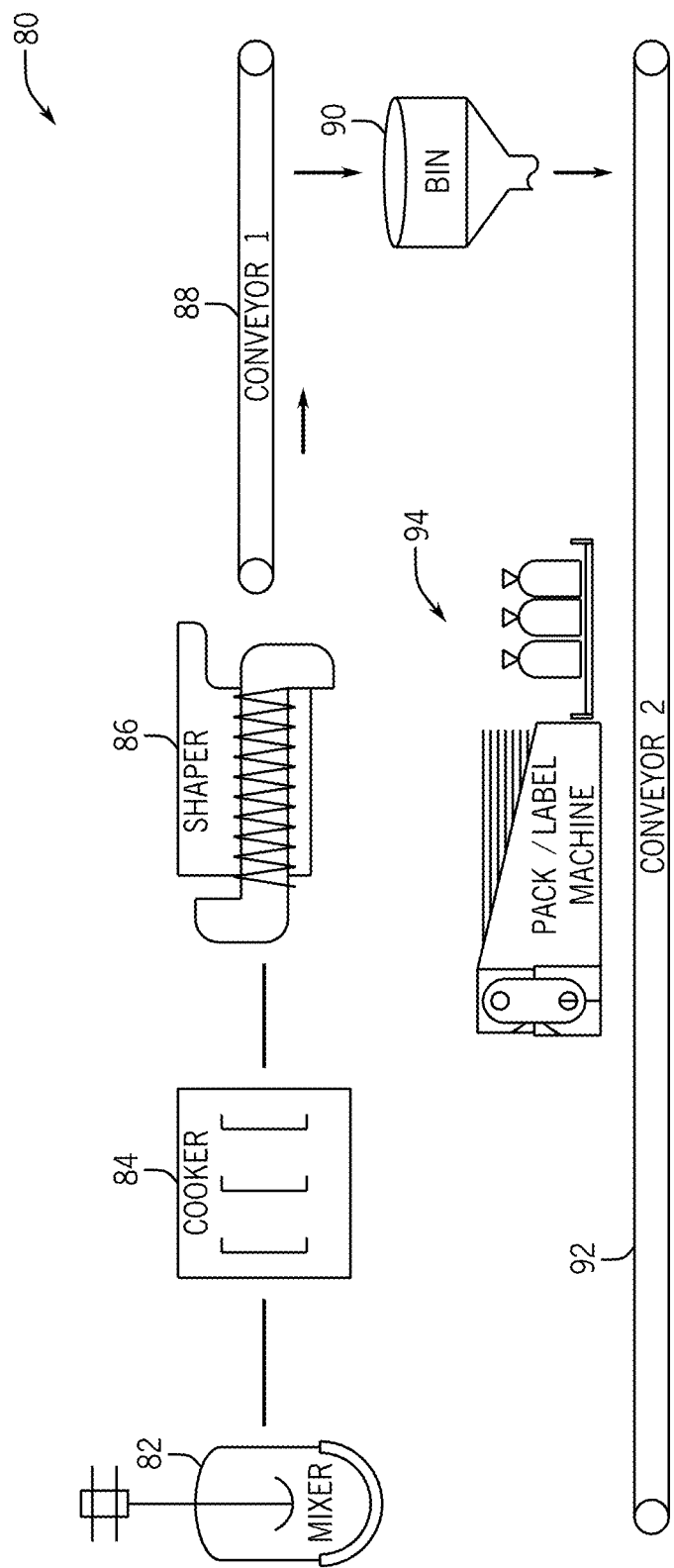
FIG. 5 illustrates a block diagram of a jelly bean manufacturing system that includes industrial automation components recommended by the system tool of FIG. 2, in accordance with an embodiment presented herein.

After querying the available resources, the system tool 12 may identify industrial automation components that may commonly be used in a jellybean manufacturing plant. As shown in FIG. 5, some components that may be part of the jellybean manufacturing system 80 may include mixer 82, a cooker 84, a shaper 86, a first conveyor 88, a bin 90, a second conveyor 92, and a pack/label machine 94. As such, the system tool 12 may provide a list of products that may suit the desires of the user of the system tool 12 for a mixer 82, a cooker 84, a shaper 86, a first conveyor 88, a bin 90, a second conveyor 92, and a pack/label machine 94.

In certain embodiments, the system tool 12 may use the additional inputs received at blocks 64-70 to provide products that may better suit the desired location of the desired system, the standards associated with the desired system, the physical space constraints associated with the desired system, the electrical information associated with the desired system, and the like. That is, the system tool 12 may analyze the available products in view of the inputs to identify products that may best match the criteria defined by the inputs.

Referring back to the jellybean manufacturing system 80 of FIG. 5, upon receiving a selection of one of the products recommended by the system tool 12, the system tool 12 may then proceed to generate a list of products that may be associated or used with the selected product. For instance, upon receiving a selection for the first conveyor 88, the system tool 12 may recommend additional products that may enable the first conveyor 88 to operate. That is, the first conveyor 88 may use components, such as the user interface 42, the industrial control system 44, the drive 46, and the motor 48 of FIG. 3, to operate the first conveyor 88. In this manner, the system tool 12 may generate an additional list of recommended products associated with a selected product. Moreover, the system tool 12 may continue to use the data collected at blocks 62-70 to refine its search results and identify the products that may be best suited for the desired industrial automation system based on various types of inference engines designed to determine which products best fit the desired uses of the respective user or organization.

Additionally, the system tool 12 may collect customer identification information that may provide some details regarding the user and/or the organization associated with the user. In certain embodiments, the customer identification information may indicate a list of industrial automation components that the user or the organization associated with the user may typically purchase or prefer to use. The customer identification information may also indicate a list of products that may be manufactured by the organization, certain industrial automation component preferences of the user and/or the organization, a purchase/implementation history record of the user and/or the organization, types of devices that the industrial automation system being designed by the user and/or the organization, and the like.

Other information that may be collected by the system tool 12 may include a language preference or location of the user, access rights associated with the user, training records associated with the user, and the like. The system tool 12 may evaluate the access rights and the training records of the user to determine a level of access to information or control of the industrial automation system that the user may have. Alternatively, this information may be used to determine a number or type of capabilities that the system tool 12 may provide the user.

Figure 6:
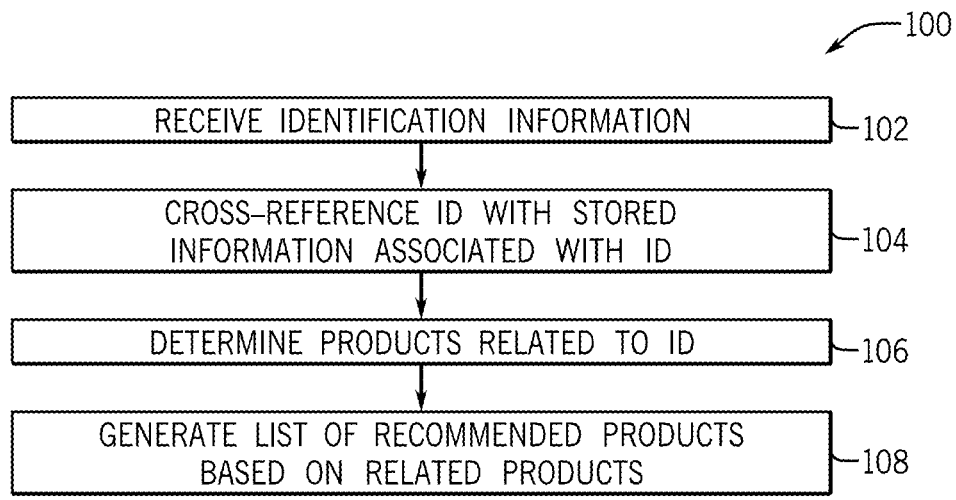
FIG. 6 illustrates a flowchart of a method for determining a list of industrial automation components for use in an industrial automation system based on customer identification information received by the system tool of FIG. 2, in accordance with an embodiment presented herein.

Keeping this in mind, FIG. 6 illustrates a flow chart of a method 100 for generating a list of products to recommend to a user based on customer identification information. The method 100 may also be used to modify the list of recommended products identified by the method 60 of FIG. 4 based on the customer identification information. In either case, it should be noted that the method 100 described herein may be performed in a number of different orders and may be combined with other methods described herein.

Referring now to FIG. 6, at block 102 the system tool 12 may receive identification information from the user. The identification information may include information related to the identity of the user or the identity of the organization associated with the user. In certain embodiments, the identification information may be stored in the database 14, the servers 16, the cloud-computing network 18, or the like. In addition to providing a way to identify the user, the system tool 12 may analyze the data stored in the database 14, the servers 16, and the cloud-computing network 18 to gain insight with regard to industrial automation components that may be preferred by the user. As such, the data stored in the database 14, the servers 16, or the cloud-computing network 18 may associate the identification information for each user or organization with a comprehensive list of industrial automation components previously purchased by the user or organization, a list of preferences previously defined by the user or the organization, a pattern of purchases made by the user or the organization, and the like. In one embodiment, the list of preferences may include the input data received via the method 60. As such, the data may include an organization that corresponds to the user of the system tool 12, an industry associated with the user, industries related to the user, industries unrelated to the user, and the like Upon receiving the identification information, at block 104, the system tool 12 may cross-reference the identification with the data available to the system tool 12 and associated with the identification information. At block 106, the system tool 12 may determine or identify industrial automation components that may be relevant to the user based on the data available to the system tool 12. For example, the system tool 12 may determine that the user previously purchased an industrial automation component that now has a newer more efficient counterpart component available. As such, the system tool 12 may, at block 108, recommend to the user via the display 22 that the user consider replacing its currently-owned industrial automation component with the newer more efficient counterpart component. In another example, the system tool 12 may determine that a complementary component may exist that may enable the previously purchased industrial automation component to operate more effectively.

In certain embodiments, after determining the existing industrial automation components of the industrial automation system associated with the identification information, the system tool 12 may identify replacement components for existing industrial automation components. The replacement components may be more efficient than the existing components. That is, the replacement components may use energy more efficiently, perform its operations more efficiently, or occupy less space (i.e., more space efficient), as compared to the existing components.

The replacement components may also be recommended for obsolete or near obsolete components, components no longer supported by the manufacturer, and the like. In one embodiment, a replacement component may be recommended for a component when a new version of the component is available. Additionally, the system tool 12 may evaluate an amount of usage of an existing component or determine an expected time until failure for the existing component to determine when a replacement component may be recommended.

In another embodiment, the system tool 12 may also identify two or more existing components of an industrial automation system that may be replaced by a fewer number of replacement components. That is, for example, one replacement component may perform the functions of two existing components. As such, the system tool 12 may reduce the total number of components present in the industrial automation system.

The system tool 12 may also analyze the previous purchases of the user or organization and generate a list of recommended services that may be performed on the currently owned industrial automation components. That is, each industrial automation component may have a recommended service or maintenance schedule that may be used to extend the life of the respective industrial automation component. The system tool 12 may be used to monitor each industrial automation component owned by the user and recommend or remind the user about when these types of services should be performed.

The system tool 12 may also determine industrial automation components at block 106 by reviewing other purchases made by different users who may have purchased the same industrial automation component as the user of the system tool 12. That is, the system tool 12 may review the user data associated with other users who may have purchased similar components as the user and may generate recommendations at block 108 based on the purchases made by those other users.

At block 106, the system tool 12 may also analyze the industrial automation components currently owned by the user of the system tool 12 and determine a set of industrial automation components that may improve the efficiency of the currently owned industrial automation component. For example, a software upgrade for a controller component may be available that may enable the controller to operate more efficiently with regard to performance, more efficiently with regard to costs, more securely, more reliably, and the like. As such, upon determining that the user of the system tool 12 may currently own the respective controller component with a previous version of the software, the system tool 12 may, at block 108, generate a recommendation to upgrade the software of the respective controller component.

In one embodiment, the system tool 12 may perform the method 100 in conjunction with the method 60 of FIG. 4.

Here, the system tool 12 may modify the list of recommended industrial automation components generated at block 72 based on the information received and analysis performed by the method 100.

Proxy-Interface Components

As mentioned above, in addition to assisting the user with designing the industrial automation system, the system tool 12 may also assist the user in retrofitting or updating an existing industrial automation system. That is, the system tool 12 may be used to provide recommendations to the user to add certain industrial components or replace certain industrial automation components in the industrial automation system, such that the newly added components may interface with components previously existing (e.g., legacy components) on the industrial automation system. These proxy-interface components may receive inputs from the legacy components and may translate the received data into a format that may be interpretable by the new components in the industrial automation system. As such, the proxy-interface components may allow the components most recently added to the industrial automation system to gain information or learn from the legacy components. Although the proxy-interface, in some instances, may not be capable of converting all of the data received from the legacy component into a format interpretable by the recently added components, by making at least some of the data of the legacy component interpretable or useful for use by the recently added components.

Figure 7:
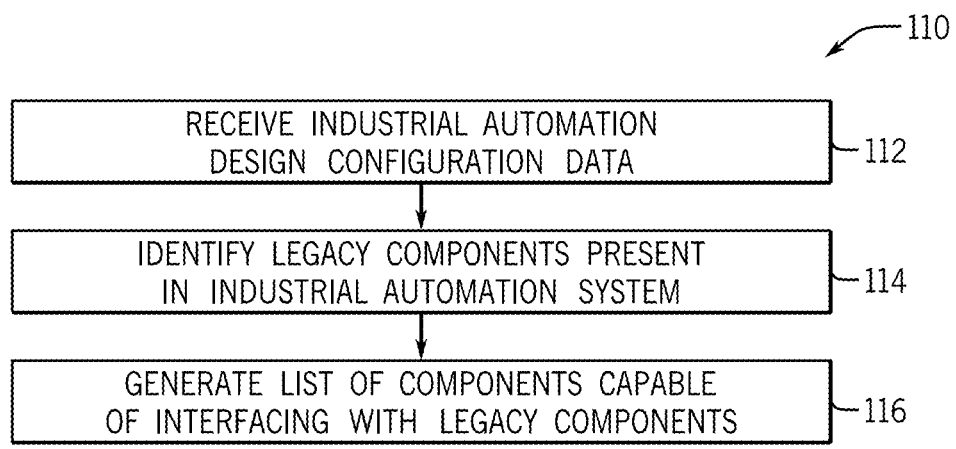
FIG. 7 illustrates a flowchart of a method for generating recommendations for proxy-interface components for use in an industrial automation system as determined by the system tool of FIG. 2, in accordance with an embodiment presented herein.

Keeping the foregoing in mind, FIG. 7 illustrates a method 110 for generating a list of proxy-interface components that may be recommended to the user by the system tool 12. At block 112, the system tool 12 may receive industrial automation design configuration data from a user, a controller, the database 14, the servers 16, or the like. The industrial automation design configuration data may detail how various components in the industrial automation system may interact with each other, may establish communication links between each other, operate with each other, or the like. As such, the design configuration data may include electrical and/or communication information or drawings that specify how various components within the industrial automation system may be connected.

For example, referring back to the jelly bean manufacturing system 80 of FIG. 5, the design configuration data may provide information regarding how the mixer 82, the cooker 84, the shaper 86, the conveyor 88, the bin 90, the conveyor 92, and the pack/label machine 94 are interconnected or work together. Moreover, the design configuration data may include additional details regarding the internal components of the mixer 82, the cooker 84, the shaper 86, the conveyor 88, the bin 90, the conveyor 92, and the pack/label machine 94. For instance, the conveyor 92 may include internal components such as the user interface 42, the industrial control system 44, the drive 46, the motor 48, the conveyor 50, and/or the I/O module 52 of FIG. 3.

In addition to the arrangement or interconnections between the components in the industrial automation system, the design configuration data may also include details regarding each component (and internal component) of the industrial automation system. That is, the design configuration data may include a serial number, model type, manufacturer information, date of commission, Internet Protocol (IP) address, and other types of information to identify each component in the industrial automation system.

At block 114, the system tool 12 may identify one or more industrial automation components present in the industrial automation system that the system tool 12 or other industrial automation components may be incapable of interfacing with. That is, a first set of components present in the industrial automation system may include components that were previously installed in the industrial automation system and may be unable to interface with a second set of components, which may have been manufactured more recently as compared to the first set of components. The first set of components or legacy components may still be operational and thus may acquire data related to the industrial automation system. However, the data acquired by the legacy components may not be in an appropriate format or may not be interpretable by the second set of components.

In this case, at block 116, the system design tool 12 may generate a list of industrial automation components (e.g., a third set of components or proxy-interface components) that may be able to translate data from one system to another. That is, the proxy-interface components may translate data received by the legacy components and provide the translated data to the other industrial automation components, such that the other industrial automation components may be able to interpret the data associated with the legacy components. Thus, the other industrial automation components may be able to control its respective operations based on the data associated with the legacy components as well as based on data received from other components native to the other components.

In one embodiment, the proxy-interface component may be a separate physical electrical component with input and output ports to receive data from the legacy components and send translated data to other components, respectively. The proxy-interface component may also include a controller or processor that may perform the translation operations to enable the other components to interpret data acquired from the legacy components.

In certain embodiments, the proxy-interface component may perform its own respective operations as well as the proxy-interfacing operations. For example, referring back to FIG. 3, upon identifying the conveyor 50 as a legacy component, the system tool 12 may generate a list of proxy-interface components that may include a replacement motor 48. The replacement motor 48 may perform its respective operation (e.g., turning shaft) and may also serve as a proxy interface for the conveyor 50. That is, the replacement motor 48 may receive data from the conveyor 50, translate the data received from the conveyor 50 into a different format, and send the translated data to the drive 46. The drive 46 may then use the translated data to determine how to adjust its respective operations. Although the proxy-interface component is described in the above example as a physical component, it should be noted that the proxy-interface component may be a software code or patch that may be added onto or incorporated into a control system of an industrial automation component. As such, the software component may perform the translation operations to provide the proxy-interface functions.

Figure 8:
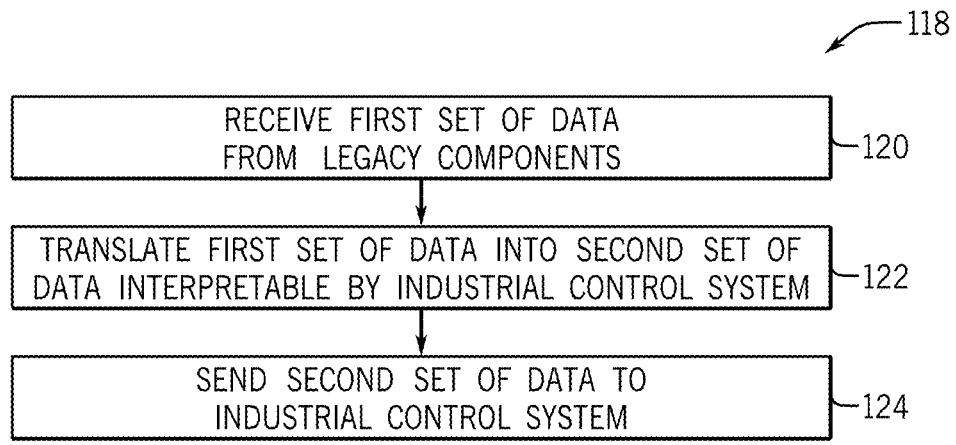
FIG. 8 illustrates a flowchart of a method that may be employed by proxy-interface components to facilitate communication between industrial automation components in the industrial automation system, in accordance with an embodiment presented herein.

Keeping this in mind, FIG. 8 illustrates a flow chart of a method 118 that may be employed by the proxy-interface component, such that data output by legacy components may be useful to other components in the industrial automation system. Referring now to FIG. 8, at block 120, the proxy-interface component receive a first set of data from components previously installed on the industrial automation system or manufactured prior to a particular date. Generally, the first set of data may be output by legacy components or components that may not be capable of interfacing with certain newer components of the industrial automation system. That is, newer components or a particular set of components may not be capable of receiving or interpreting the first set of data due to a formatting issue, a programming language issue, or the like.

At block 122, the proxy-interface component may translate the first set of data into a second set of data that may be interpretable by other industrial automation components communicatively coupled to the proxy-interface component. In one embodiment, the proxy-interface component may translate the first set of data into the second set of data using certain translation functions that may correspond to a type of data that corresponds with the first set of data. As such, the translation functions may be pre-programmed into an industrial automation component that may serve as a proxy-interface component for the type of data associated with the first set of data. Alternatively, the translation functions may be downloaded by an industrial automation component from the database 14, the cloud-computing network 18, or the like.

In any case, at block 124, the proxy-interface component may send the second set of data to other industrial automation components of the industrial automation system. As a result, the other industrial automation components may have access to or knowledge of data acquired by legacy components. The other industrial automation components may then adjust their respective operations based on data they acquire and data from legacy components.

In certain embodiments, the proxy-interface component may also provide brand-based awareness functionalities. That is, the proxy-interface component may communicate with certain components manufactured by a different manufacturer than the other industrial automation components that may be present in the industrial automation system. By communicating with the components manufactured by a different manufacturer, the proxy-interface component may still provide information to other industrial automation components such that they may base their operational decisions according to data acquired by components manufactured by different manufacturers.

Figure 9:
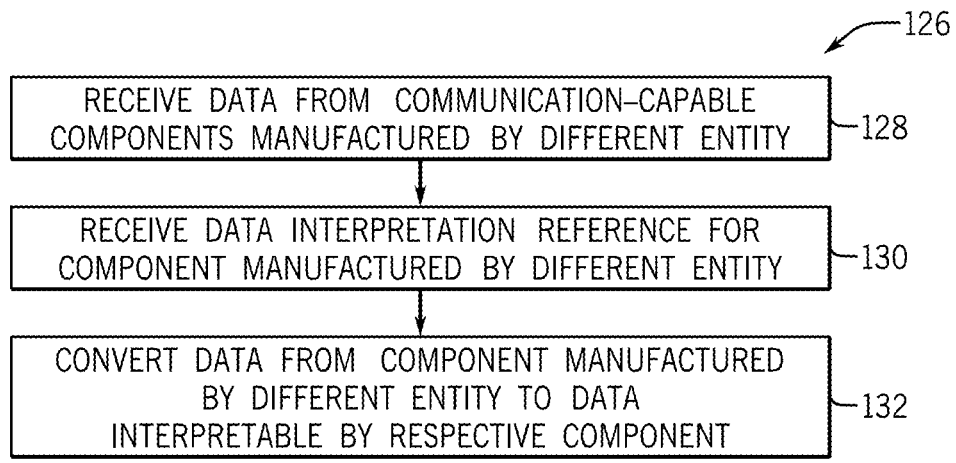
FIG. 9 illustrates a flowchart of a method for communicating with industrial automation components manufactured by a different entity, in accordance with an embodiment presented herein.

Keeping this in mind, FIG. 9 illustrates a method 126 for interpreting data received by components manufactured by other entities as compared to the awareness-enabled component performing the method 126. At block 128, the proxy-interface component may receive data from various components manufactured by one or more different entities or organizations as compared to the manufacturer of other industrial automation components present in the system. In one embodiment, the data received from the various components may include information or metadata indicating the respective manufacturer of the respective components.

At block 130, the proxy-interface component may query a database or some data reference tool that includes data interpretation references or data translation keys for components manufactured by other entities. The database may be organized with respect to an organization name, a product, and the like. Upon determining the manufacturer of the device based on the data received at block 128, the proxy-interface component may retrieve a data interpretation reference or key from the database that corresponds to the organization's name and product. The data interpretation reference may provide translation keys for commands sent out from the device manufactured by a different entity. Moreover, the data interpretation reference may also include a reference that details where various types of data may be stored at various memory locations of the device manufactured by a different entity.

At block 132, the proxy-interface component may convert data output by the device manufactured by a different entity into data that may be interpretable by the proxy-interface component using the data interpretation reference. That is, the proxy-interface component may translate the data output by the device into a format that may be interpretable by the proxy-interface component and by other industrial automation components in the industrial automation system. In certain embodiments, the other industrial automation components may then access various memory locations of the device manufactured by a different entity to receive data acquired by the respective component. The other industrial automation components may use the data to adjust the operations of their respective components. That is, the other industrial automation components may determine how the data may affect the operations of the overall industrial automation system or the respective other industrial automation components and may then adjust the operations of the respective components to operate efficiently, to meet certain operational goals, and the like.

Proxy-Virtualizing Components

In addition to proxy-interface components, the system tool 12 may recommend that the user add proxy-virtualizing components to the industrial automation system. Proxy-virtualizing components may generate virtual data for existing components that are incapable of communicating the data it acquires to other components in the industrial automation system. In this manner, the newly added or replacement components may be configured to serve as proxy-virtualizing components within the industrial automation system. Proxy-virtualizing components may receive data from various internal components or other industrial automation components via a wired or wireless communication link. The proxy-virtualizing components may then generate virtual data for industrial automation components that are not capable of communicating with other components.

In certain embodiments, proxy-virtualizing components may be a separate device that may interface with an industrial automation component that may lack communication capabilities via one or more I/O ports 32 as described above with reference to FIG. 2. Additionally, the device may include a communication component 24 as described above with reference to FIG. 2. As such, the device may receive the data acquired by the respective component lacking communication capabilities via the I/O ports 32 and may transmit the received data to other industrial automation components. In one embodiment, the device may include a processor 26 as described above with reference to FIG. 2. Here, the device may analyze the data received from the respective industrial automation component and may transmit the analyzed data to other industrial automation components.

Figure 10:
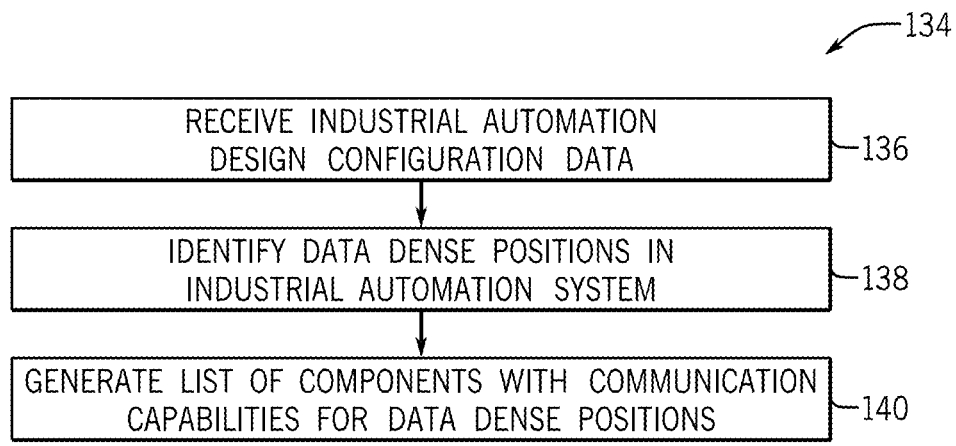
FIG. 10 illustrates a flowchart of a method for identifying positions in an industrial automation system that may be suited for proxy industrial automation components, in accordance with an embodiment presented herein.

Keeping the foregoing in mind, FIG. 10 illustrates a flowchart of a method 134 for identifying positions within an industrial automation system that may be suited for proxy-virtualizing components. In one embodiment, the system tool 12 described above may perform the techniques described herein. However, it should be noted that the techniques described herein may be performed by various applications that may be accessed via industrial automation components, the cloud-computing network 18, or the like.

Referring now to FIG. 10, at block 136, the system tool 12 may receive the industrial automation design configuration data described above from a user, a controller, the database 14, the servers 16, or the like. At block 138, the system tool 12 may identify data dense positions in the industrial automation system based on the design configuration data. The data dense positions may be located within the industrial automation system that may be located in strategic positions that may have access to data from various components. In one embodiment, the data dense positions may include locations within the industrial automation system where aggregated data from a number of different components may be collected. In general, the identified data dense positions may be strategically located such that if a proxy-virtualizing component was placed in the identified position, the proxy-virtualizing component may generate virtual data for other components near the identified position. These other components may not be capable of communicating data that it may have acquired. As such, these other components may not be aware of the circumstances and situations that may be occurring nearby. For example, if a fault is detected in an upstream component, such as the motor 48 of FIG. 3, a communication-incapable component, such as the conveyor 50, located downstream from the fault may not be aware of the fault condition.

Generally, proxy-virtualizing components may be capable of connecting to an industrial automation network that may facilitate communication between other industrial automation components communicatively coupled to the industrial automation network. The industrial automation network may include any wired or wireless network, such as the Internet, a local area network (LAN), a wide area network (WAN), EtherNet/IP, ControlNet, DeviceNet, any other industrial communication network protocol, and the like. The proxy-virtualizing component may include properties that enable the proxy-virtualizing component to be recognized once the industrial automation component is connected to the industrial automation network. Moreover, awareness-enabled industrial automation components already connected to the industrial automation system may be able to recognize other industrial automation components as they connect to the industrial automation network. Since these awareness-enabled components have the ability to recognize other industrial automation components, the awareness-enabled industrial automation components may become aware of the industrial automation environment in which they exist. That is, the awareness-enabled industrial automation components may use the data acquired by other components to more efficiently control the operations of the industrial automation system by communicating with other industrial automation components and altering certain operations of the devices and controllers to maximize the efficiency of the energy used in the industrial automation system, the production of the industrial automation system, any number of other quality attributes associated with the industrial control system, or any combination thereof.

In certain situations, once the awareness-enabled industrial automation components recognize each other and begin communicating with each other via the industrial automation network, each awareness-enabled industrial automation component may become aware of various attributes pertaining to other industrial automation components in the industrial automation system via the industrial automation network. As such, each awareness-enabled industrial automation component may optimize their respective operations within the industrial automation system with respect to the attributes of the other industrial automation components. For example, an awareness-enabled industrial automation component may receive data from other components that may be in the same or different part of the industrial automation system. The data may include system configurations for the other components, maintenance schedules for the other components, system design modifications for the other components, user preferences for the components, and any other data that may be stored in or acquired by the other components.

In general, the awareness-enabled component recognizes a presence of other components in the industrial automation network and their respective capabilities and relationships within the industrial automation system. As such, an awareness-enabled component may make operational decisions that account for the effects of the decisions with respect to the operations of the other components on the industrial automation network. By consciously making operational decisions that account for the operations of other components, the awareness-enabled component may efficiently manage the operation of the entire industrial automation system.

Referring now back to FIG. 10, after identifying data dense positions in the industrial automation system, the system tool 12 may, at block 140, generate a list of proxy-virtualizing components that may be suited for the data dense positions. Proxy-virtualizing components may include components that may be able to interpret data received from its respective sensors disposed on its respective component along with data received from other components via the I/O ports to determine how various sections, parts, or components in the industrial automation system may be operating. Referring back to the example above, the system tool 12 may recommend adding a switchgear device upstream from the drive 46. The recommended switchgear device may be selected based on characteristics of the drive 46 and/or a load that corresponds with the conveyor 50, such as a voltage rating of the drive 46 or current rating of the motor 48 and/or the conveyor 50, and/or other characteristics of the conveyor 50. The recommended switchgear device may also include a controller or control system that may communicatively couple to a controller or control system associated with the drive 46. The controller or control system of switchgear device may communicatively couple to various data ports of the conveyor 50 and the drive 46. Additionally, the switchgear device may receive data from its respective sensors related to the electrical properties of the drive 46 and/or the motor 48. In one embodiment, the switchgear device (i.e., proxy-virtualizing component) may generate virtual data that simulates the load on the conveyor 50 based on the data received from the motor 48. The virtual data may indicate how the conveyor 50 may be performing under the fault condition. As such, the switchgear device became aware of the fault condition in the drive 46 and may determine the effects of the fault condition on the conveyor 50. If the switchgear device determines that the fault condition may reduce the operational capabilities of the conveyor 50 or the like, the switchgear device may open a circuit connection to the drive 46.

By adding proxy-virtualizing components to an existing industrial automation system, the industrial automation system may be retrofitted such that more components may be aware of various properties of different components and sections of the industrial automation system. Adding proxy-virtualizing components may allow an awareness control scheme to better manage the operations of various sections of the industrial automation system using the awareness data acquired via proxy and/or the proxy-virtual data.

In certain embodiments, the virtual data scheme may be used when designing a new industrial automation system, such that proxy-virtualizing components may be strategically placed throughout the industrial automation system and non-awareness-enabled components may be used elsewhere to save on costs and the like. For example, it may not be economically feasible for an industrial automation system to include an awareness-enabled component for each device in the system. As such, the user may employ the method 134 described above to locate certain positions within the industrial automation system that may be best suited to include proxy-virtualizing components. That is, the positions identified by the method 134 may allow the user to maximize the amount of virtual data that may be generated or data that may be acquired from different devices using the least amount of awareness-enabled components.

Keeping the foregoing in mind, when retrofitting an existing industrial automation system, the system tool 12 may also recommend that various sensors or components in the industrial automation system be replaced with new sensors or components that may interface with an awareness-enabled control system. That is, the replacement components may provide the control system with information that may enable the control system to become aware of various properties of the industrial automation system that data was lacking.

Figure 11:
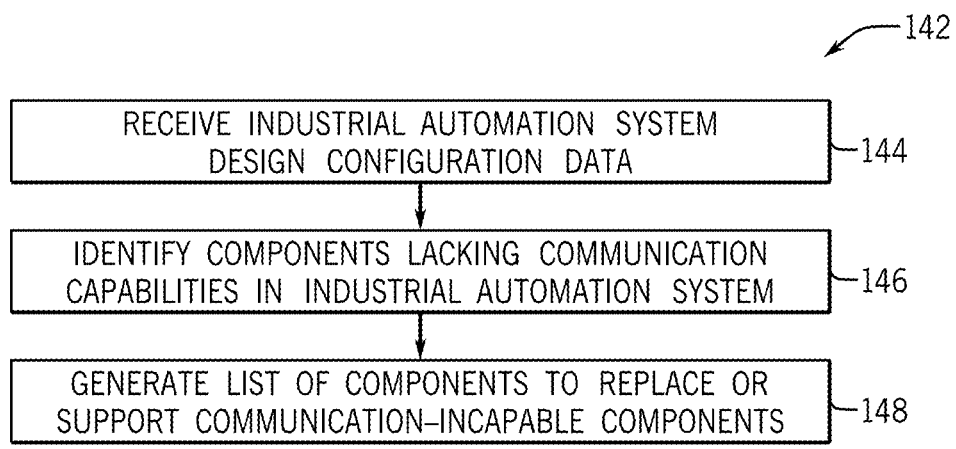
FIG. 11 illustrates a flowchart of a method for identifying industrial automation components that lack communication capabilities and recommending industrial automation components to replace the identified components, in accordance with an embodiment presented herein.

FIG. 11 illustrates a method 142 for determining replacement or support components for the industrial automation system. At block 144, the system tool 12 may receive industrial system design configuration data as described above with respect to block 136 of FIG. 10.

At block 146, the system tool 12 may identify components in the industrial automation system that may be lacking communication or awareness capabilities based on the system tool. That is, the system tool 12 may identify the components that may be stand-alone components that do not interact with other components, do not react to data related to other components, do not receive data from other components, or the like.

At block 148, the system tool 12 may generate a list of awareness-enabled components that may replace the components identified at block 144. In one embodiment, the system tool 12 may generate a list of components that may be used to support or complement the existing components. For example, the system tool 12 may recommend connecting a proxy-interface component to the identified component. The proxy-interface component, as described above, may include a processor, a communication component, and I/O ports. The proxy-interface component may interface with the identified component to receive data acquired by the identified component via the I/O ports of the proxy device. The proxy-interface component may then transmit the data acquired by the identified component to other communication-enabled components.

In certain embodiments, after a proxy-interface component is coupled to other components within the industrial automation system, the control systems for other components may automatically recognize the awareness-enabled components and the proxy-interface components that are part of the industrial automation system. Here, the control systems may automatically use the proxy-interface component to interpret data for various non-awareness-enabled components. As such, the control system may account for non-awareness-enabled components when performing certain operations.

Figure 12:
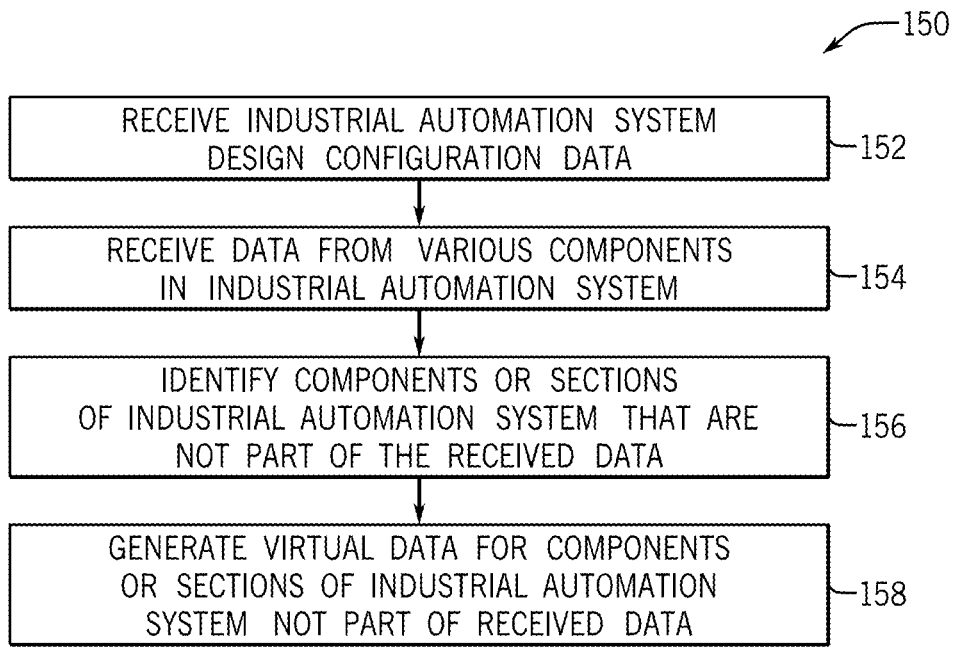
FIG. 12 illustrates a flowchart of a method for generating virtual data for components lacking communication capabilities, in accordance with an embodiment presented herein.

Referring now again to the proxy-virtualizing components, FIG. 12 illustrates a method 150 employed by the proxy-virtualizing components to generate virtual data for components or sections of an industrial automation system that may be lacking awareness or communication capabilities. At block 152, the proxy-virtualizing component may receive the industrial automation system design configuration data as described above. The proxy-virtualizing component may use the design configuration data to understand the architecture or arrangement of components within the industrial automation system.

At block 154, the proxy-virtualizing component may receive data from various components within the industrial automation system. The data may be related to data acquired by sensors on the respective components or may have been processed by the respective components.

At block 156, the proxy-virtualizing component may identify components or sections of the industrial automation system that are not represented by the data received at block 154. In this manner, the control system may identify components or sections of the industrial automation system that the control system is not aware of or lacks information for.

At block 158, the proxy-virtualizing component may then generate virtual data for the identified components or sections of the industrial automation system. As such, the proxy-virtualizing component may determine expected data or virtual data for the identified components or sections of the industrial automation system based on the data received at block 154 and the industrial automation system design configuration data. That is, the proxy-virtualizing component may determine how the identified components or sections of the industrial automation system should be performing or the data that the identified components or sections of the industrial automation system should be receiving. For example, the proxy-virtualizing component may determine how much energy one identified component may be consuming based on the amount of energy being consumed by other like devices.

In certain embodiments, the proxy-virtualizing component may employ a proxy scheme that may incorporate multiple standards in which the virtual data for each non-awareness-enabled component may be generated. For example, the proxy-virtualizing component may employ a generic proxy that may command for each awareness-enabled component to calculate certain types of data expected at various non-awareness-enabled components when certain information is available to the respective awareness-enabled component. The results of each of the calculating components may then be compared using various statistical algorithms to determine data that has the highest probability of reflecting the data at the non-awareness-enabled component.

In one embodiment, each awareness-enabled component may perform the proxy functions for each non-awareness-enabled component or section of the industrial automation system. However, this scheme may involve increased processing power for each awareness-enabled component. As such, it may be beneficial to specify a particular control system to generate the virtual data for the non-awareness-enabled component or section based on the data received from the awareness-enabled components. The specified control system may be located or communicatively coupled to components that may provide the specified control system with the most relevant data related to the non-awareness-enabled component. In one embodiment, a physical device may be added to an awareness-enabled component to provide the respective component additional computing or processing power for generating the virtual data.

When generating the virtual data at block 158, the proxy-virtualizing component or the awareness-enabled component may use a library of awareness proxy algorithms to determine how to generate the virtual data for various components. The library of proxy algorithms may be accessed via the database 14, the servers 16, the cloud-computing network 18, or the like. The library may include rules or procedures to employ under different circumstances. For instance, the library may specify that when a particular sensor is present on an awareness-enabled component, the virtual data for another component be generated based on the data received from the particular sensor.

Figure 13:
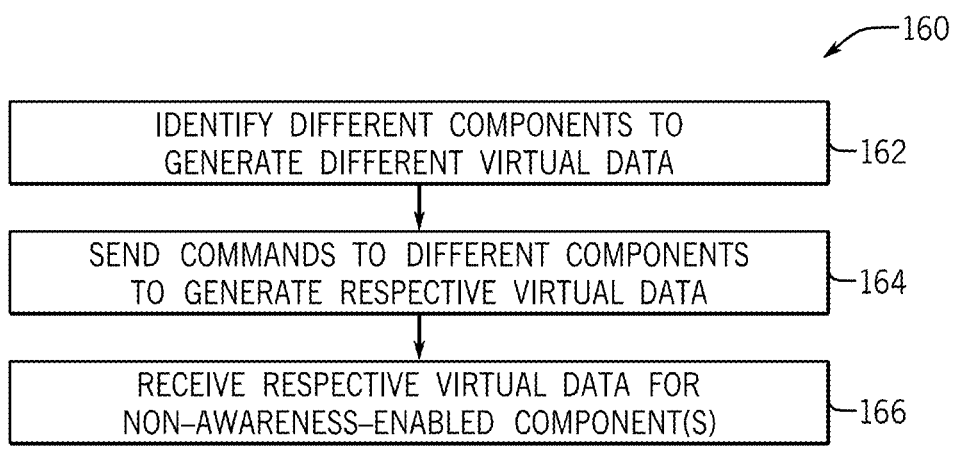
FIG. 13 illustrates a flowchart of a method for calculating different virtual data for a component lacking communication capabilities using a number of different industrial automation components, in accordance with an embodiment presented herein.

As discussed above, the proxy-virtualizing component may identify different awareness-enabled components to generate virtual data for various components. Keeping this in mind, FIG. 13 depicts a flowchart of a method 160 for distributing the generation of virtual data for various components to certain awareness-enabled components.

At block 162, the proxy-virtualizing component may identify different awareness-enabled components in the industrial automation network that may be capable of generating virtual data for a respective component. When identifying the awareness-enabled components, the proxy-virtualizing component may analyze the position of an awareness-enabled component with respect to the component that the virtual data is being generated for. For example, the proxy-virtualizing component may identify an awareness-enabled component that may have access to more data related to the non-awareness-enabled component as compared to other awareness-enabled components in the industrial automation system. Moreover, the proxy-virtualizing component may analyze the processing load of each awareness-enabled component and distribute the generation of virtual data between each component based on providing a balanced processing load of each component. In certain embodiments, the proxy-virtualizing component may identify different awareness-enabled components to generate different types of virtual data for a respective non-awareness-enabled component. The proxy-virtualizing component may also take into consideration and be able to recommend configurations that have redundant or backup components when a component designated for generating virtual data fails.

After identifying the components to generate the virtual data, at block 164, the proxy-virtualizing component may send commands (e.g., in the form of configuration, script or executable code) to the identified awareness-enabled components to generate the virtual data for the respective non-awareness-enabled components. In certain embodiments, the proxy-virtualizing component may send commands to various awareness-enabled components to route certain types of data to a respective awareness-enabled component, which may be generating the virtual data for a non-awareness-enabled component. For example, an awareness-enabled component designated to generate virtual energy data associated with a non-awareness-enabled component may receive energy data from other awareness-enabled components to generate the virtual energy data. At block 166, the proxy-virtualizing component may receive the virtual data for the respective non-awareness-enabled components. In this way, the proxy-virtualizing component may use the virtual data to improve the operation of the respective component.

User Adaptation

In addition to providing recommendations for components to add or replace in the industrial automation system, the system tool 12 may display the recommendations as well as certain details regarding the respective component, portions of the industrial automation system, or the entire industrial automation system on a graphical user interface (GUI).

Generally, the GUI or user interface of an industrial automation component may enable a user to monitor variables in the industrial automation system, adjust the operation of various components in the industrial automation system, and the like. The GUI may also enable the user to modify a design of the industrial automation system or to perform maintenance operations on various components within the industrial automation system. As such, it would be beneficial to dynamically adapt the user interface or the data being presented via the user interface based on information related to the user, the respective industrial automation component, the industrial automation system, or the like.

Figure 14:
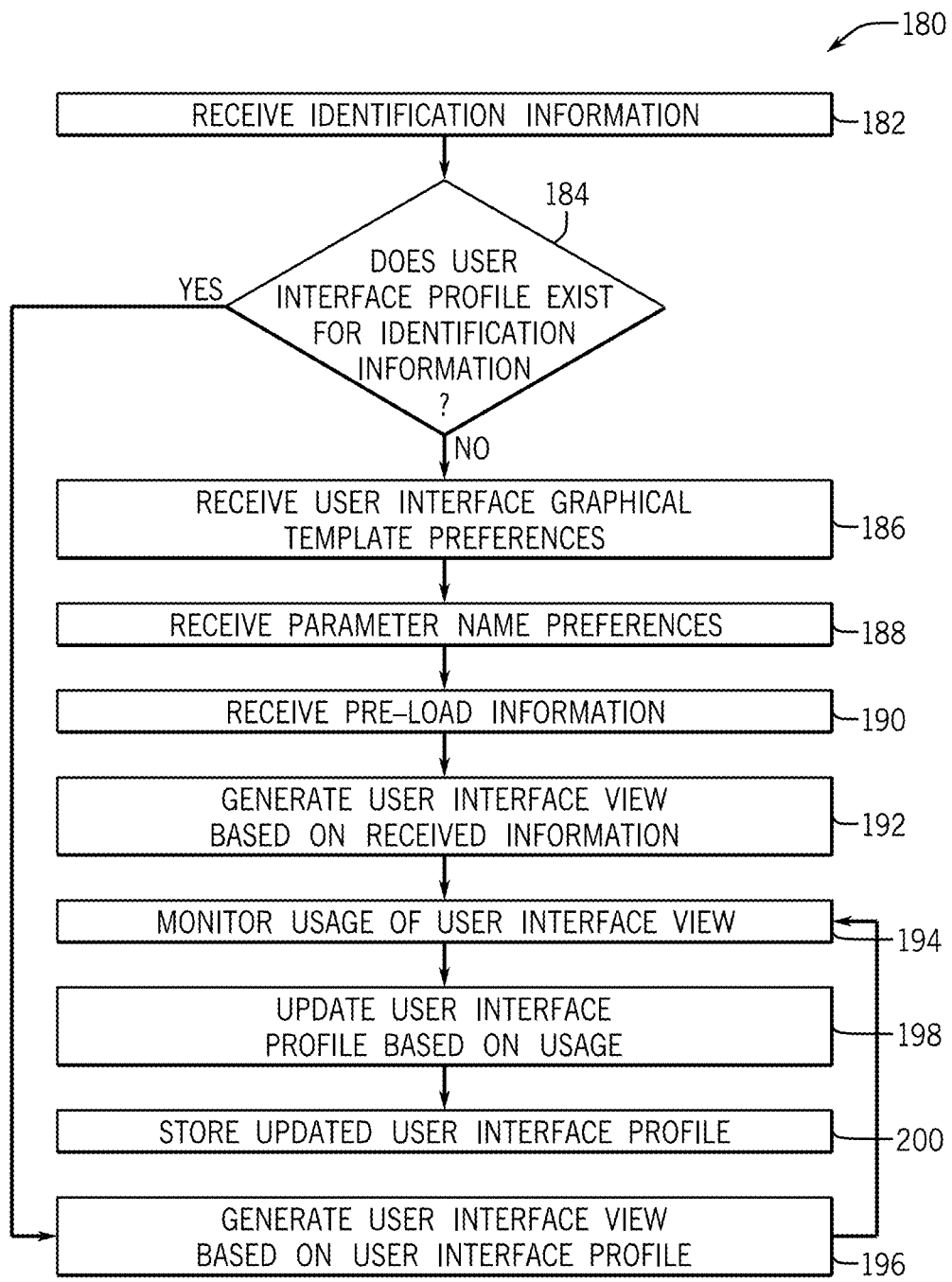
FIG. 14 illustrates a flowchart of a method for modifying a user interface view, in accordance with an embodiment presented herein.

Keeping the foregoing in mind, FIG. 14 illustrates a flowchart of a method 180 for adjusting a user interface displayed for the designer, operator, or maintainer of the industrial automation system via the GUI, the display 22, or the like. As mentioned above, the system tool 12 may be implemented using a GUI or some interface visually depicted in the display 22. As such, the system tool 12 may perform the techniques described herein, but it should be noted that the user interface may be accessed via the cloud-computing network 18 or the like.

Referring now to FIG. 14, at block 182, the system tool 12 may receive identification information from the user using the system tool 12. The identification information may include the identification information described above with reference to block 102 of FIG. 6. Generally, the identification information may be a code or name that may be attributed to a particular user of the respective industrial automation component.

At block 184, the system tool 12 may determine whether a user interface profile currently exists for the identification information received at block 182. As such, the system tool 12 may consult the database 14, the servers 16, the cloud-computing network 18, or the like, which may store a number of user interface profiles. The user interface profile may provide details regarding how the GUI of the system tool 12 may be depicted on the display 12. For example, the user interface profile may indicate that the user primarily views certain parameters regarding the respective industrial automation component, primarily adjusts the settings of certain operating parameters for the respective industrial automation component, prefers a particular graphics template for the GUI of the respective industrial automation component, prefers certain colors, prefers certain language or locale setting, has access that is constrained based on access rights, training, certifications, etc., or the like.

If the user interface profile exists, the system tool 12 may proceed to block 196 and generate the user interface view on the GUI or the display 22 based on the user interface profile. If, however, the user interface profile does not exist for the received identification information, the system tool 12 may proceed to block 186.

Figure 16:
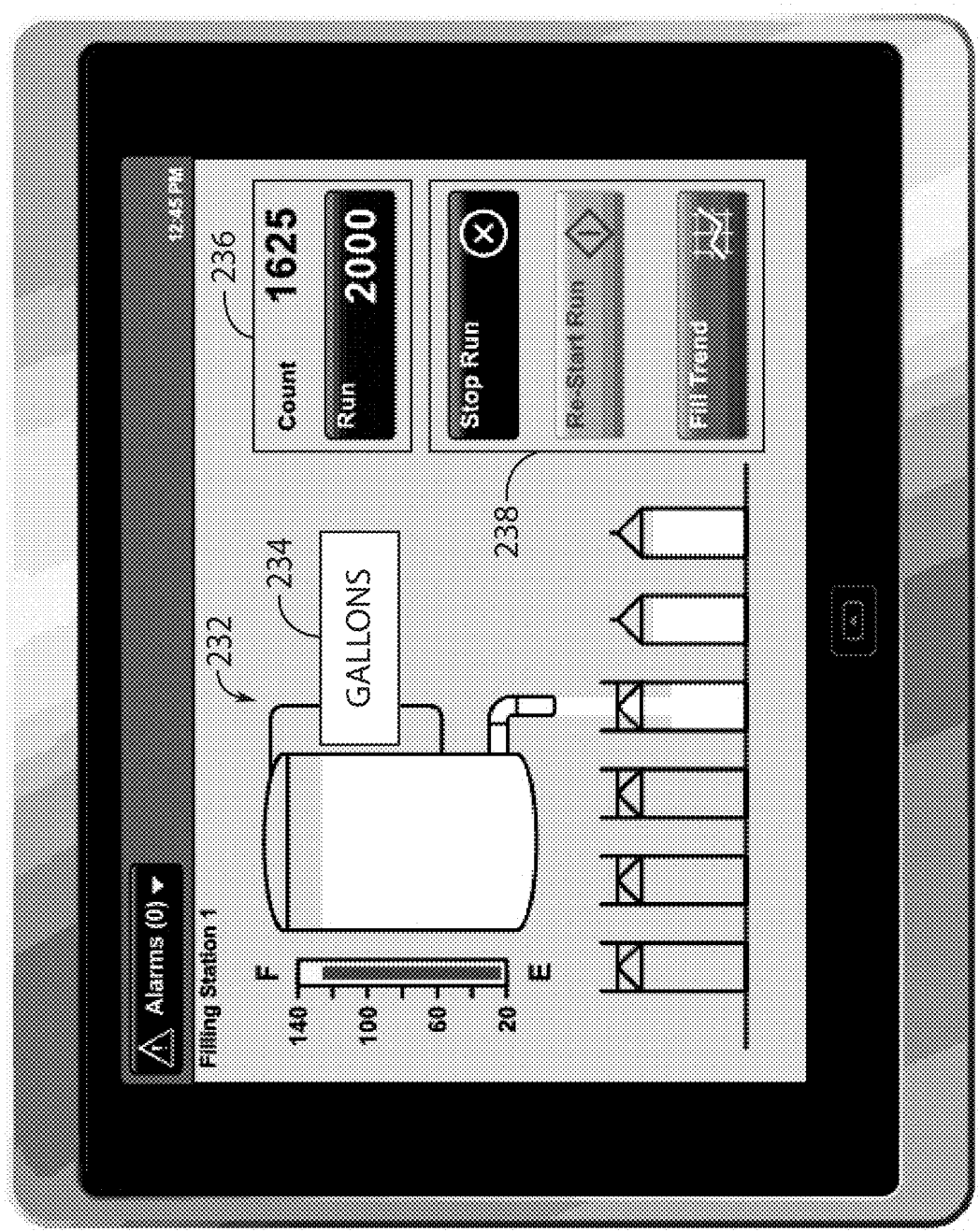
FIG. 16 illustrates an example user interface view, in accordance with an embodiment presented herein.

At block 186, the system tool 12 may receive a user interface graphical template preference from the user. In one embodiment, the system tool 12 may display a list of graphical templates that may be employed by the system tool 12. The system tool 12 may initially display a number of graphical templates using a number of thumbnail images that may depict an arrangement of the template. For example, the template may include a graphical dashboard of values that may be of interest to the user of the component. The template may also include a visualization of the functions performed by the component. The template may also include various customizable features regarding the user interface such as tool components, windows, features, menus, and the like based on the respective user. For example, FIG. 16 illustrates a visualization depicting a filling station.

At block 188, the system tool 12 may receive parameter name preferences. Generally, each parameter measured or acquired by the respective component may be attributed to a particular parameter name. Each individual organization or operator may use a different naming principle or code to derive parameter names. For instance, the parameter name may be generated based on a particular user, company, industry, country, or other attribute associated with the respective component or the location at which the component may be installed.

As such, at block 188, the user may specify the parameter prefix or suffix names and numeral values to use as parameter names for various parameters measured or acquired by the respective component. For example, flow values indicating an amount of fluid flow through various pipes may include a parameter prefix of "FLUIDFLOW." Each parameter may then be numbered in chronological order: "FLUIDFLOW1," "FLUIDFLOW2," "FLUIDFLOW3," etc.

At block 190, the system tool 12 may receive pre-load information. Pre-load information may include data that may be pre-loaded into the respective component before the respective component is operational. The preload information or data may be stored in the database 14, the servers 16, the cloud-computing network 18, or the like. The pre-load data may include various reference values such as alarm limits, measurement units (e.g., standard/metric), and the like.

At block 192, the system tool 12 may generate the user interface view based on the inputs received at blocks 186-190. In one embodiment, the inputs received at blocks 186-190 and the user interface view generated at block 192 may be stored as an user interface profile.

After the user interface view is generated, the system tool 12 may, at block 194, monitor how the user uses the user interface. As such, the system tool 12 may monitor the graphics used by the user more frequently, the arrangement of the icons or visualizations in the user interface, the parameter names used for new measurement values, and the like. The monitored properties may also include monitored properties of the system tool 12 itself, such as the use of components, windows, features, and menus, etc. with respect to the user. The properties may also include preferred topologies for various systems, starting templates for various systems, narrowing recommended components to a list of components determined to be desirable by the user, and the like.

Using these monitored properties, at block 198, the system tool 12 may update the user interface profile associated with the user of the system tool 12. As such, the system tool 12 may monitor the user's use of the user interface, components added and subtracted to the industrial automation system, and the like. The system tool 12 may then make recommendations that may include different types or arrangements or configuration of the user interface views, recommended products, and the like based on the user's usage history. The system tool 12 may thus recognize patterns in the user's usage history and make certain recommendations based on the recognized patterns. In this manner, as the system tool 12 learns more about the user's preferences, the system tool 12 may continuously modify or adjust the data presented on the user interface to accommodate the user's preferences and tasks thereby simplifying the users' workflows over time. In one embodiment, instead of modifying the presentation of the user interface, the system tool 12 may present recommendations that propose to change the presentation of the user interface. In this way, the user may determine whether the modified presentation is desirable. The system tool 12 may also provide an option for the user to revert back to the previous configuration or presentation of the user interface after the presentation is either automatically modified or manually modified via the acceptance of a recommendation.

At block 200, the system tool 12 may store the updated user interface profile in the database 14, the servers 16, the cloud-computing network 18, or the like. As such, the user interface profile for different products and platforms can be in different form factors (phone, tablet, desktop) delivering different user experiences for the same tasks. As such, the same customizations may transcend between various devices and form factors that may be accessible to the user as the user uses different components that may be physically located at various places. In this way, customization of the user interface profile may be stored in a common repository (e.g., workstation, server, or cloud). The user may then be able to use his respective user interface profile as he moves between different platforms or products based on his various tasks. That is, different products and platforms may be available to the user in different form factors (e.g., phone, tablet, desktop), but the same user interface profile may be used to transcend between the various devices and form factors to provide the user with a similarly formatted user interface regardless of the device he is using. The user may thus efficiently use the user interface of various components based on his preferred views.

Figure 15:
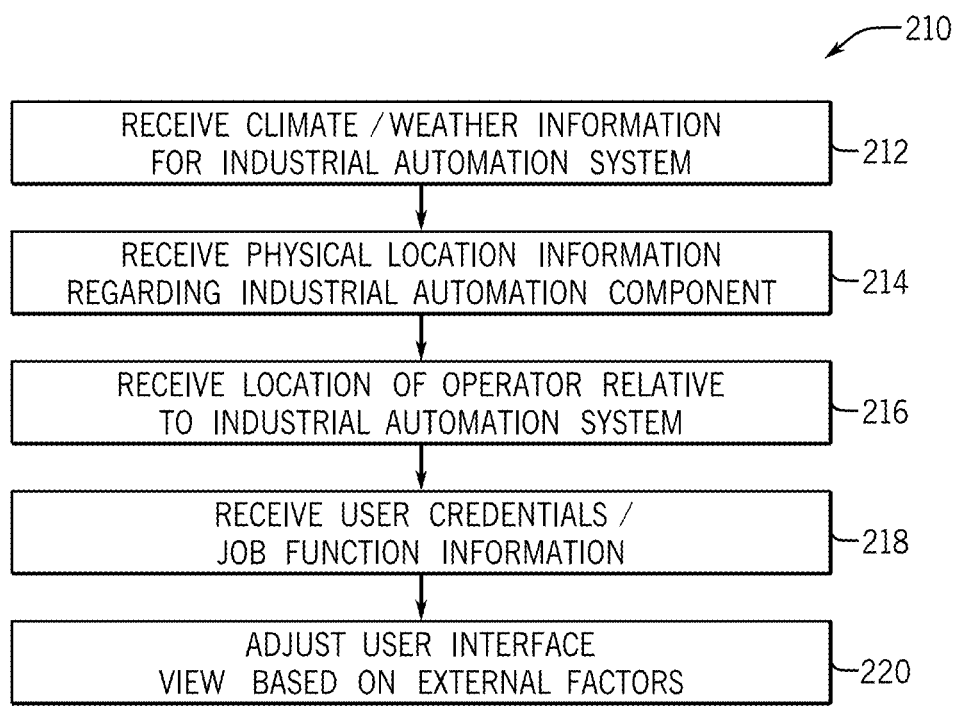
FIG. 15 illustrates a flowchart of a method for modifying a user interface view based on external factors, in accordance with an embodiment presented herein.

In addition to the inputs received at blocks 186-190 discussed above, the system tool 12 may receive various external factors regarding the respective component or the user when providing the user interface view. FIG. 15, for example, illustrates a flowchart of a method 210 for adjusting the user interface view of the system tool 12 based on various external factors. In certain embodiments, the information received in the method 210 discussed below may be acquired from external data sources such as Internet-based sites and the like. However, it should be noted that the data received during the method 210 may also be provided via inputs by the user.

Referring now to FIG. 15, at block 212, the system tool 12 may receive climate or weather conditions associated with the physical location of the respective component. In one embodiment, the system tool 12 may retrieve weather updates from a data service via the Internet or some other network. The weather updates may include information regarding temperature, storms, weather advisories, and the like.

At block 214, the system tool 12 may receive location information regarding the respective industrial automation component. The location information may be acquired via a global positioning system (GPS) device, wireless network data analysis, and the like. The location information may be linked to other data, such as news or energy prices, that may be received by the system tool 12. For example, based on the location of the respective component, the prices for energy may vary according to various schedules. That is, certain locations may have off-peak times and lower energy rates at specific time periods. The location information may enable the system tool 12 to keep track of various types of data (e.g., energy pricing) that may change based on the location of the respective component.

At block 216, the system tool 12 may receive a location of the user relative to the industrial automation system. That is, the system tool 12 may receive the position of the respective component being used by the user with respect to the industrial automation system. The position of the respective component being used by the user may be used to identify other components that may be physically located near the respective component. As such, the system tool 12 may present data that may be of interest to the user of the respective component even though the data may be related to another component. For example, the system tool 12 may display an alarm that may be present on another component that may be located close to the respective component. In this manner, the user may be alerted of issues that he may have the ability to address.

At block 218, the system tool 12 may receive information regarding the credentials and/or job functions of the operator. In one embodiment, the user may possess a badge or key that may include digital information that indicates his credentials, job functions, title, or the like. Alternatively, the digital information may be retrieved from the database 14, the cloud-computing network 18, or the like. The information may also include a list of operations, components, and tools that the user may be able to access and use.

After receiving the inputs described above, at block 220, the system tool 12 may adjust the user interface view based on the external factors received at blocks 212-218. For example, FIG. 16 illustrates an example of a user interface view 230 of a filling station. The user interface view 230 includes visualization 232 of a process being performed by the respective industrial automation component or the respective industrial automation system. The user interface view 230 may also include a data field 234 that may indicate data or a value that may be of interest to the user. In the same manner, the user interface view 230 may include status visualization 236 that may indicate a current status of the process being performed. The user interface view 230 may also include command list visualization 238 that may provide various options regarding the commands that may be initiated by the user via the user interface view 230. In one embodiment, the presence and the location of the data field 234, the status visualization 236, and the command list visualization 238 may be determined based on the method 180 described above.

Figure 17:
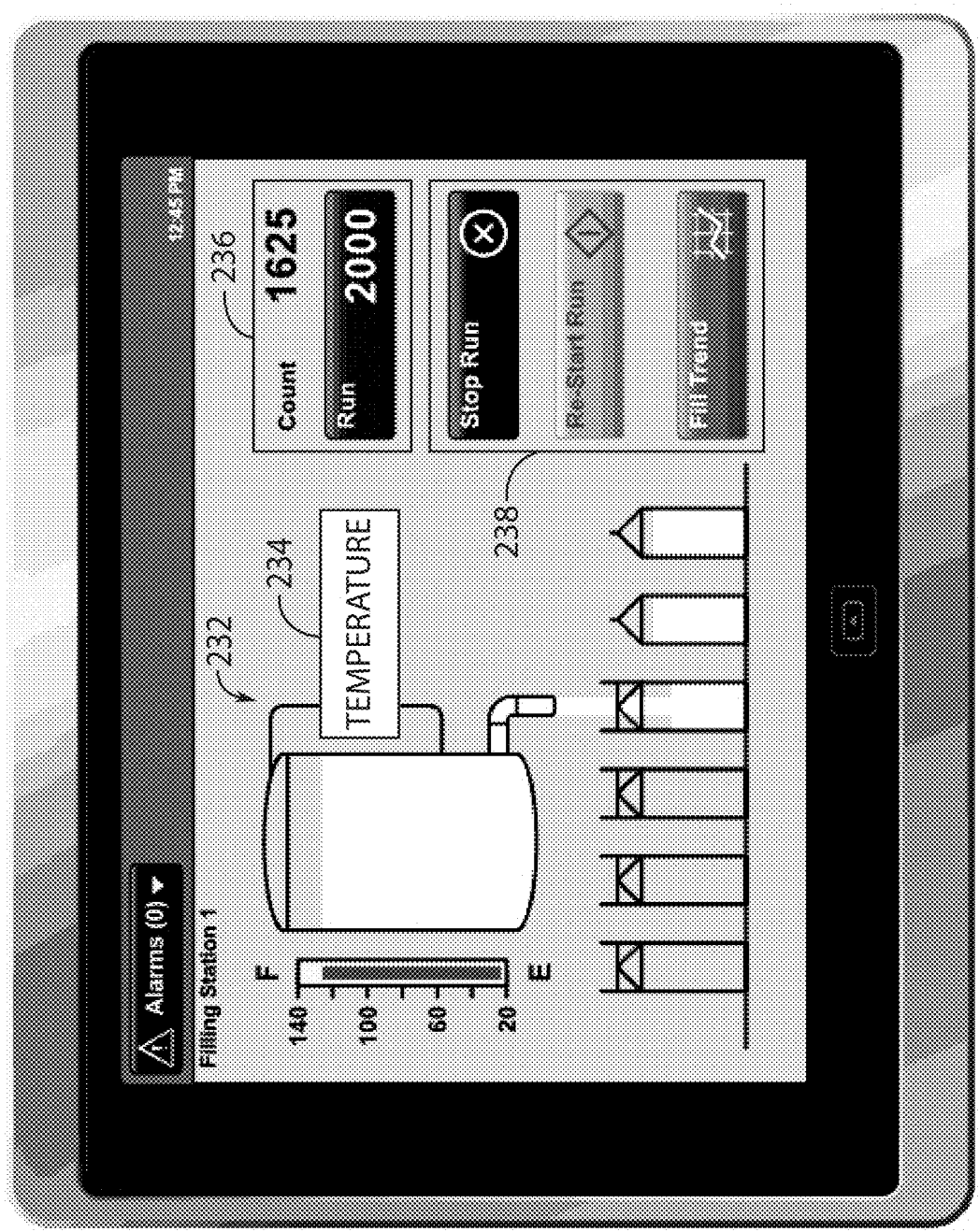
FIG. 17 illustrates an example user interface view modified from the user interface view of FIG. 16 based on the method of FIG. 15, in accordance with an embodiment presented herein.

Keeping the user interface view 230 in mind, upon receiving the information at blocks 212-218 as described above, the system tool 12 may adjust the visualizations depicted on the user interface view 230 based on the received information. For example, if the system tool 12 receives a weather update at block 212 indicating that the temperature is reaching values that are above some threshold, the system tool 12 may adjust the user interface view to indicate the temperature as the data field 234. That is, the user interface view 230 of FIG. 16 may be updated as shown in the user interface view 250 of FIG. 17. In this manner, the user interface view may be updated based on data that may be of interest or relevance to the operator.

In the same manner, the system tool 12 may present relevant news or pricing values that may be based on the physical location of the respective component, as received at block 214. The system tool 12 may present alarms or other data that may be related to other components located relatively close to the respective component with respect to the industrial automation system based on the location information received at block 216.

Moreover, in one embodiment, the user interface view may be adjusted to present certain data based on the credentials, job functions, a title associated with the respective user received at block 218, training records associated with the respective user, certifications associated with the respective user, and the like. That is, the user interface views depicted on the GUI may be altered based on a user's job tasks, function, or the like. As such, a user interface for a user who operates certain machines in the industrial automation system may include a view that only allows him to view data related to the certain components that he may have authority to operate. In the same manner, the view depicted on the user interface may be determined based on the location of the GUI being used to operate the tool. That is, if the GUI is located in a control room of an industrial automation facility, the user interface may provide various views to enable the user to control and monitor various items related to the control of the industrial automation facility. If, however, the GUI is located in a relatively remote location with respect to other components in the industrial automation system, the user interface may provide items related to controlling just the component located in the remote location.

In addition to adjusting the items or visualizations depicted in the user interface, in one embodiment, the user interface may be adjusted to depict scaled views of the user interface. For instance, FIG. 18 illustrates a flowchart of a method 260 for adjusting a scale of a user interface view in a GUI of the industrial automation component. At block 262, the system tool 12 may display the user interface view, which may include a visualization of a number of components being monitored or displayed via the GUI by the system tool 12.

That is, the user interface can be scaled out to broadly view major or large components in an industrial automation system. The user interface may also display a more detailed or granular view of the industrial automation system after receiving a request to scale down or zoom into a section of the industrial automation system. In one embodiment, the scales in which the industrial automation system may be displayed may be controlled using a slider graphic or the like. In another embodiment, the scales in which the industrial automation system may be displayed may be categorized into various levels of a hierarchy or the like. The levels may include, for example, a plant view, a room view, a electrical component view, a production view, a component view, a sensor view, and the like.

At block 264, the system tool 12 may receive a view scale input via view scale visualization. For example, FIG. 19 depicts a visualization 270 that includes all of the components of the jellybean manufacturing system of FIG. 5 along with a scale slider visualization 272. The scale slider visualization 272 may receive the view scale input at block 264. That is, the scale slider visualization 272 may control an amount of components being displayed in the display 22. As shown in FIG. 19, an input 274 of the scale slider visualization 272 is positioned at the right end of the scale slider visualization 272. In one embodiment, the right end of the scale slider visualization 272 may correspond to a broad or complete view of the components associated with the system tool 12. For instance, referring again to FIG. 19, the visualization 270 depicts all of the components of the jellybean manufacturing system of FIG. 5 when the input 274 is positioned at the far right of the scale slider visualization 272.

Although the view scale input has been described with the scale slider visualization 272, it should be noted that the view scale input may be implemented in a number of different ways. For example, the system tool 12 may receive a keyboard input, a double-click input, or the like to adjust the view scale of the visualization displayed.

Figure 20:
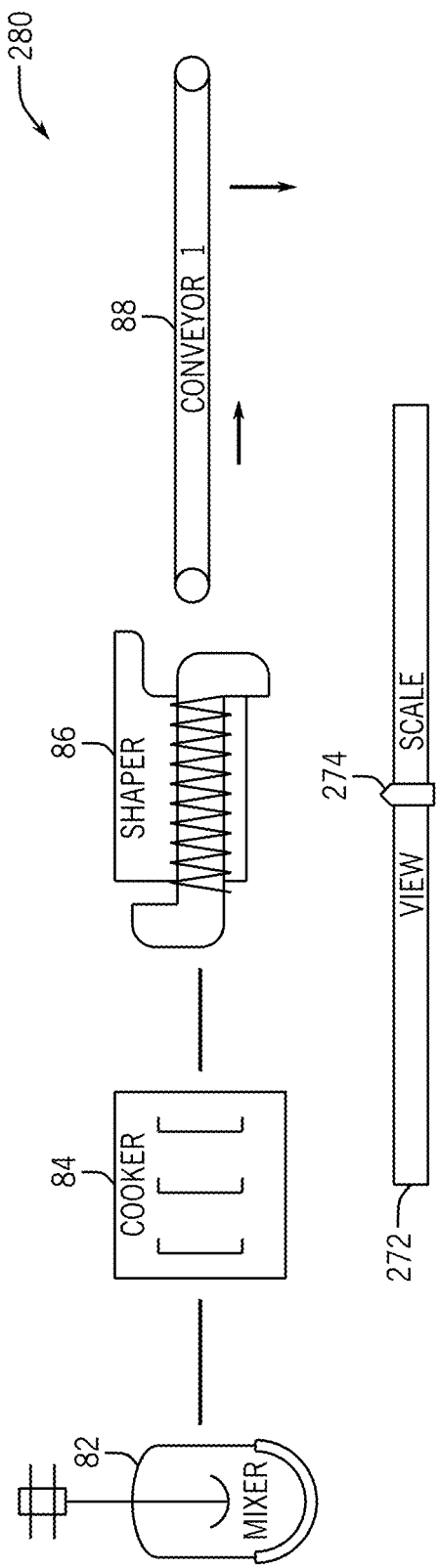
FIG. 20 illustrates a schematic diagram of an example user interface view with a view scale graphical input modified with respect to the example user interface view of FIG. 19, in accordance with an embodiment presented herein.

Referring back to FIG. 18, at block 266, the system tool 12 may adjust the user interface view based on the view scale input received at block 264. For example, as shown in FIG. 20, the visualization 270 of FIG. 19 is altered to present visualization 280, which depicts fewer components or a narrower view of the components of the visualization 270. That is, since the input 274 of the scale slider visualization 272 is moved away from one extreme end of the scale slider visualization 272, the resulting visualization 280 zooms into or presents a closer view of the components of the jellybean manufacturing system of FIG. 5.

Figure 21:
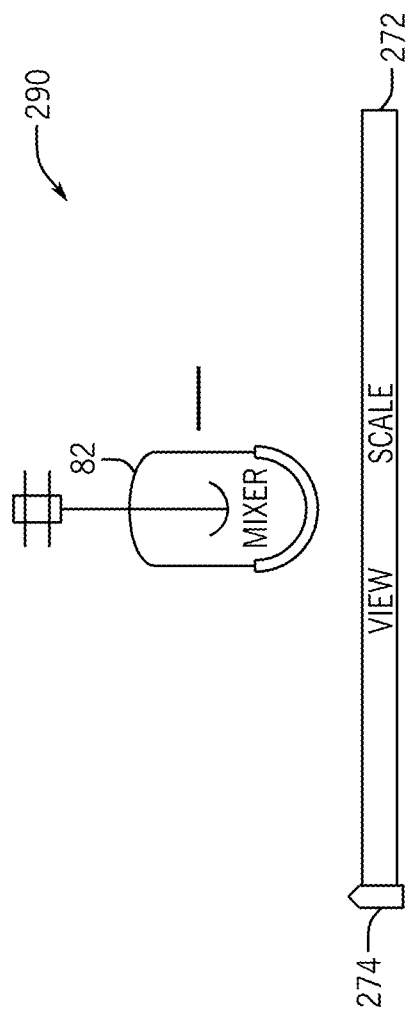
FIG. 21 illustrates a schematic diagram of an example user interface view with a view scale graphical input modified with respect to the example user interface view of FIG. 20, in accordance with an embodiment presented herein.

In the same manner, when the input 274 is positioned on the far left of the scale slider visualization 272, the resulting visualization 290 of FIG. 21 includes one component of the jellybean manufacturing system of FIG. 5. In certain embodiments, the scale slider visualization 272 may provide more granular or broader scales of visualizations based on user preferences, which may be part of the user interface profile. For example, the visualization 290 may be zoomed into further to illustrate the industrial automation components, such as those illustrated in FIG. 3.

By adjusting the scale in which the visualizations are depicted in the display 22, the operator may focus on different aspects of the industrial automation system. That is, the operator may gain an understanding of the entire system, including how each component works with each other. The operator may also be capable of analyzing details of a particular component. In certain embodiments, as the depicted scale of the visualization is adjusted, the visualizations 232, the data fields 234, the command list visualization 236, and the like may be adjusted to correspond to the components depicted on the display 22.

In addition to manually adjusting the scale in which the visualizations are depicted, the system tool 12 may automatically adjust the scale in which the visualizations are depicted based on the credentials of the user, the training records of the user, the certifications of the user, and the like. For instance, referring to U.S. patent application Ser. Nos. 14/267,481; 14/267,508; 14/267,576; 14/267,594; and 14/267,617 mentioned above, which are incorporated herein by reference, the industrial automation system may be categorized into various hierarchical levels. Keeping this in mind, in one embodiment, the system tool 12 may display certain hierarchical levels based on the certain characteristics regarding the user providing the input to the industrial control system 44. That is, the system tool 12 may display different hierarchical levels to the user via the user interface view based on certain credentials of the user. The credentials of the user may be determined based on user interface profile described above. In one embodiment, the user credentials may indicate to the system tool 12 the role of the user with respect to the industrial automation system. For example, certain users may be part of an operational or maintenance team, while other users may be part of a supervisory or management team. As such, the system tool 12 may display different hierarchical levels of the industrial automation system based on the corresponding role of the user.

Figure 22:
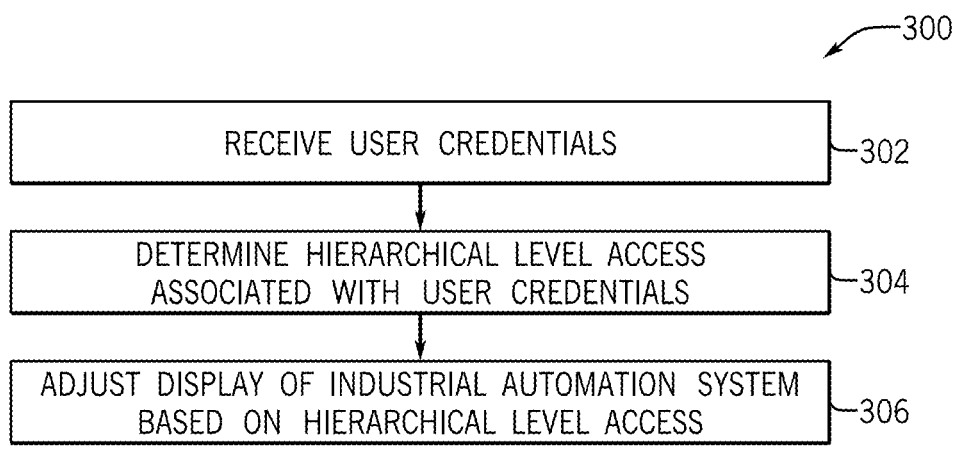
FIG. 22 illustrates a flowchart of a method for automatically adjusting a scale of the user interface view, in accordance with an embodiment presented herein.

For example, FIG. 22 illustrates a method 300 for modifying the visualizations depicted in the display 22 based on a user's credentials. At block 302, the system tool 12 may receive user credentials associated with the user operating the industrial control system 22. The user credentials may be linked to the identification information received at block 182 of FIG. 14.

At block 304, the industrial control system 44 may determine a list of hierarchical levels of the industrial automation system that the respective user may be approved to access or control based on the user credentials. In certain embodiments, lower level users (e.g., maintenance/operational personnel) may be limited to using control functions that may control the operation of specific components that may be part of a relatively low granular hierarchical level of the entire industrial automation system (e.g., FIG. 21). As such, at block 306, the system tool 12 may depict visualizations according to a scale that includes just the component(s) that the respective user may be approved to access.

Alternatively, higher-level users (e.g., supervisors/managers) may be provided access to additional control functions that may control the operation of the components that may be part of broader hierarchical levels of the industrial automation system. In this manner, the higher-level users may have greater control of the industrial automation system and thus it may be useful to view a larger scale view of the industrial automation system. As such, at block 306, the system tool 12 may display visualizations that include the hierarchical levels associated with the components that the respective user may be permitted to access.

By employing the method 300, the system tool 12 may enable a given user may to view and thus operate within certain heirarchical levels of the industrial automation system. These heirarchical levels may be directly associated with each other or may be located in multiple disjoint places of the entire hierarchy. In certain embodiments, the system tool 12 may allow a user to view information or visualizations related to any heirarchical level of the industrial automation system regardless of its credentials. However, in other embodiments, the method 300 may be combined with the method 260 of FIG. 18 to limit the visualizations depicted for the user manually providing an input to the system tool 12. That is, the user may provide an input to the view scale visualization 272, as discussed above with reference to the method 260, but the system tool 12 may only depict visualizations or information related to visualizations that the system tool 12 determines that the user may access according to the method 300. As such, the system tool 12 may provide the user an ability to scale visualizations to a particular hierarchical level, but the visualizations or information not associated with the user's credentials may be obscured.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A non-transitory computer-readable medium comprising computer-executable instructions that, when executed, are configured to cause a processor to:

receive a first set of data from a first set of industrial automation components manufactured by a first entity, wherein the first set of industrial automation components is manufactured by the first entity and is not in communication with a second set of industrial automation components manufactured by a second entity that is different from the first entity, and wherein the first set of data comprises manufacturer identity data and product data;

identify reference data based on the manufacturer identity data and the product data;

retrieve the reference data from a storage component, wherein the reference data comprises information that enables the processor to translate the first set of data into a second set of data interpretable by the second set of industrial automation components manufactured by the second entity;

convert the first set of data into the second set of data based on the reference data; and send the second set of data to the second set of industrial automation components, wherein the second set of industrial automation components is configured to adjust one or more operations based on the second set of data.

2. The non-transitory computer-readable medium of claim 1, wherein the computer-executable instructions are configured to cause the processor to:
determine that an industrial system comprising the first set of industrial automation components and the second set of industrial automation components is operating below an operational goal based on a third set of data;
send the second set of data to the second set of industrial automation components in response to determining that industrial system is operation below the operational goal.

3. The non-transitory computer-readable medium of claim 1, wherein the computer-executable instructions that, when executed, are configured to cause the processor to convert the first set of data into the second set of data comprises translating a first programming language associated with the first set of industrial automation components to a second programming language associated with the second set of industrial automation components.

4. The non-transitory computer-readable medium of claim 1, wherein the computer-executable instructions that, when executed, are configured to cause the processor to download the reference data based on the first entity comprises:
identifying metadata indicative of the first entity within the first set of data;
determining the first entity based on the metadata; and
retrieving the reference data comprising a data interpretation key corresponding to the first entity; and
converting the first set of data into the second set of data using the data interpretation key.

5. The non-transitory computer-readable medium of claim 1, wherein the reference data is indicative of one or more memory locations for various types of data stored within the first set of industrial automation components.

6. The non-transitory computer-readable medium of claim 5, wherein the reference data is indicative of one or more additional memory locations configured to store the second set of data, and wherein the computer-executable instructions that, when executed, are configured to cause the processor to convert the first set of data into the second set of data comprises sending the second set of data to the second set of industrial automation components via the one or more additional memory locations.

7. The non-transitory computer-readable medium of claim 1, wherein the reference data is stored in a database accessible via cloud computing network.

8. The non-transitory computer-readable medium of claim 1, wherein the second set of industrial automation components comprises a software component.

9. A method, comprising:
receiving, via a processor, a first set of data from a first set of industrial automation components manufactured by a first entity, wherein the first set of industrial automation components is not in communication with a second set of industrial automation components manufactured by a second entity that is different from the first entity, and wherein the first set of data comprises manufacturer identity data and product data;
identifying, via the processor, reference data based on the manufacturer identity and the product data;
retrieving, via the processor, the reference data from a storage component, wherein the reference data comprises information that enables the processor to translate the first set of data into a second set of data interpretable by the second set of industrial automation components manufactured by the second entity;
converting, via the processor, the first set of data into the second set of data based on the reference data; and
sending, via the processor, the second set of data to the second set of industrial automation components, wherein the second set of data is configured to adjust one or more operations based on the second set of data.

10. The method of claim 9, comprising sending the second set of data via one or more memory locations, wherein the reference data is indicative of the one or more memory locations configured to the second set of data.

11. The method of claim 9, comprising converting the first set of data into the second set of data based on a data interpretation key, wherein the reference data comprises the data interpretation key.

12. The method of claim 9, further comprising:
identifying metadata indicative of the first entity within the first set of data;
determining the first entity based on the metadata;
retrieving the reference data comprising a data interpretation key corresponding to the first entity; and
converting the first set of data into the second set of data using the data interpretation key.

13. The method of claim 9, wherein converting the first set of data into the second set of data comprises translating a first programming language associated with the first set of industrial automation components to a second programming language associated with the second set of industrial automation components.

14. The method of claim 9, wherein converting the first set of data into the second set of data comprises modifying a format of the first set of data.

15. A non-transitory computer-readable medium comprising computer-executable instructions that, when executed, are configured to cause a processor to:
receive a first set of data from a first set of industrial automation components manufactured by a first entity that is not in communication with a second set of industrial automation components manufactured by a second entity that is different from the first entity, wherein the first set of data comprises manufacturer identity data and product data;
identify reference data based on the manufacturer identity data and the product data;
retrieve the reference data from a storage component, wherein the reference data comprises information that enables a processor to translate the first set of data into a second set of data interpretable by the second set of industrial automation components;
convert the first set of data into the second set of data based on the reference data;
determine a third set of industrial automation components that is affected by the second set of data; and
send a control signal to the third set of industrial automation components based on the second set of data, wherein the control signal is configured to adjust one or more operations of the third set of industrial automation components.

16. The non-transitory computer-readable medium of claim 15, wherein the storage component comprises a cloud-computing component.

17. The non-transitory computer-readable medium of claim 15, wherein the computer-executable instructions that, when executed, are configured to cause the processor to:
determine that an industrial system including the first set of industrial automation components and the second set of industrial automation components is operating below an operational goal based on a third set of data; and send the second set of data to the second set of industrial automation components in response to determining that industrial system is operation below the operational goal.

18. The non-transitory computer-readable medium of claim 15, wherein the computer-executable instructions that, when executed, are configured to cause the processor to convert the first set of data into the second set of data comprises translating a first programming language associated with the first set of industrial automation components to a second programming language associated with the second set of industrial automation components.

19. The non-transitory computer-readable medium of claim 15, wherein the reference data comprises a data interpretation key configured to convert the first set of data into the second set of data.

20. The non-transitory computer-readable medium of claim 15, wherein the reference data is indicative of one or more memory locations for various types of data stored within the first set of industrial automation components.

* * * * *